(12) United States Patent
Kuwabara

(10) Patent No.: US 9,179,545 B2
(45) Date of Patent: Nov. 3, 2015

(54) BASE MATERIAL WITH A CONDUCTOR PATTERN, AND A METHOD OF FORMING A BASE MATERIAL WITH A CONDUCTOR PATTERN

(75) Inventor: Shin Kuwabara, Fukushima (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 281 days.

(21) Appl. No.: 13/504,862

(22) PCT Filed: Oct. 27, 2010

(86) PCT No.: PCT/JP2010/069077
§ 371 (c)(1),
(2), (4) Date: Jun. 11, 2012

(87) PCT Pub. No.: WO2011/052641
PCT Pub. Date: May 5, 2011

(65) Prior Publication Data
US 2012/0241203 A1  Sep. 27, 2012

(30) Foreign Application Priority Data

Oct. 27, 2009 (JP) ................................. 2009-247077
Oct. 27, 2009 (JP) ................................. 2009-247125

(51) Int. Cl.
*H05K 1/11* (2006.01)
*H05K 3/38* (2006.01)
(Continued)

(52) U.S. Cl.
CPC .. *H05K 1/11* (2013.01); *B32B 7/02* (2013.01); *B32B 23/04* (2013.01); *B32B 23/20* (2013.01); *B41M 1/10* (2013.01); *B41M 1/30* (2013.01); *H05K 1/118* (2013.01); *H05K 3/1208* (2013.01); *H05K 3/386* (2013.01); *H05K 9/0096* (2013.01); *B32B 2457/20* (2013.01); *H05K 3/1275* (2013.01); *H05K 2203/0113* (2013.01);
(Continued)

(58) Field of Classification Search
CPC .......... H05K 1/11; H05K 1/118; H05K 3/386
See application file for complete search history.

(56) References Cited

U.S. PATENT DOCUMENTS

| 6,607,825 B1 * | 8/2003 | Wang et al. .................. 428/343 |
| 2004/0191497 A1 | 9/2004 | Hiraoka et al. |

(Continued)

FOREIGN PATENT DOCUMENTS

| CN | 101035684 A | 9/2007 |
| JP | 9-275266 A | 10/1997 |

(Continued)

OTHER PUBLICATIONS

International Search Report for the Application No. PCT/JP2010/069077 mailed Feb. 1, 2011.

*Primary Examiner* — Jeremy C Norris
(74) *Attorney, Agent, or Firm* — McDermott Will & Emery LLP

(57) ABSTRACT

Provided is a base material having a conductor pattern formed thereon, which is obtained by forming, at a high productivity on a base material, a conductor pattern having a lower surface resistivity and a higher conductivity than in the related art. A receiving layer 5 made of a cellulose acetate alkylate is formed on a surface of a base material 4. A conductor pattern 6 is formed by printing a conductive paste 3 in a predetermined pattern shape onto the surface of the receiving layer 5.

10 Claims, 11 Drawing Sheets

(51) Int. Cl.
*B41M 1/10* (2006.01)
*B41M 1/30* (2006.01)
*H05K 3/12* (2006.01)
*H05K 9/00* (2006.01)
*B32B 7/02* (2006.01)
*B32B 23/04* (2006.01)
*B32B 23/20* (2006.01)

(52) U.S. Cl.
CPC *H05K2203/0143* (2013.01); *H05K 2203/1545* (2013.01)

(56) References Cited

U.S. PATENT DOCUMENTS

| | | |
|---|---|---|
| 2006/0286371 A1 | 12/2006 | Kim et al. |
| 2008/0103043 A1 | 5/2008 | Uchida et al. |
| 2009/0044972 A1 | 2/2009 | Kitajima et al. |
| 2009/0183910 A1* | 7/2009 | Sunohara .................... 174/266 |
| 2009/0280305 A1 | 11/2009 | Ishikawa et al. |

FOREIGN PATENT DOCUMENTS

| | | |
|---|---|---|
| JP | 11-170420 A | 6/1999 |
| JP | 2002-050864 A | 2/2002 |
| JP | 2002-219864 A | 8/2002 |
| JP | 2002-261437 A | 9/2002 |
| JP | 2004-296504 A | 10/2004 |
| JP | 2005-340360 A | 12/2005 |
| JP | 2007-130780 A | 5/2007 |
| JP | 2007-281290 A | 10/2007 |
| JP | 2008-211010 A | 9/2008 |
| JP | 2008-283008 A | 11/2008 |
| JP | 2008-300724 A | 12/2008 |
| JP | 2009-4617 A | 1/2009 |
| JP | 2009-27155 A | 2/2009 |
| JP | 2009-49136 A | 3/2009 |
| JP | 2009-49275 A | 3/2009 |
| JP | 2009-76827 A | 4/2009 |
| JP | 2009-177108 A | 8/2009 |
| JP | 2009-238549 A | 10/2009 |
| WO | WO-2004/087432 A1 | 10/2004 |

* cited by examiner

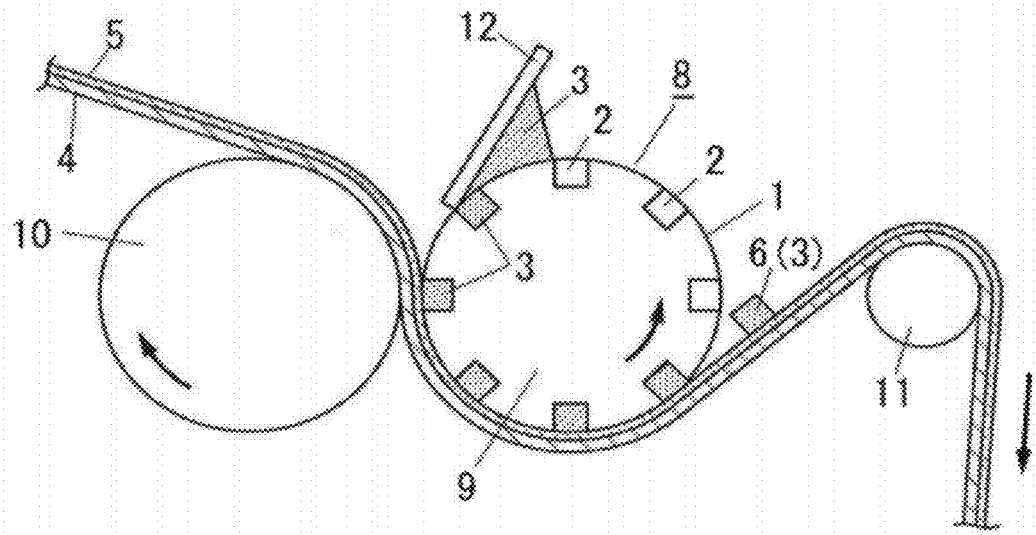
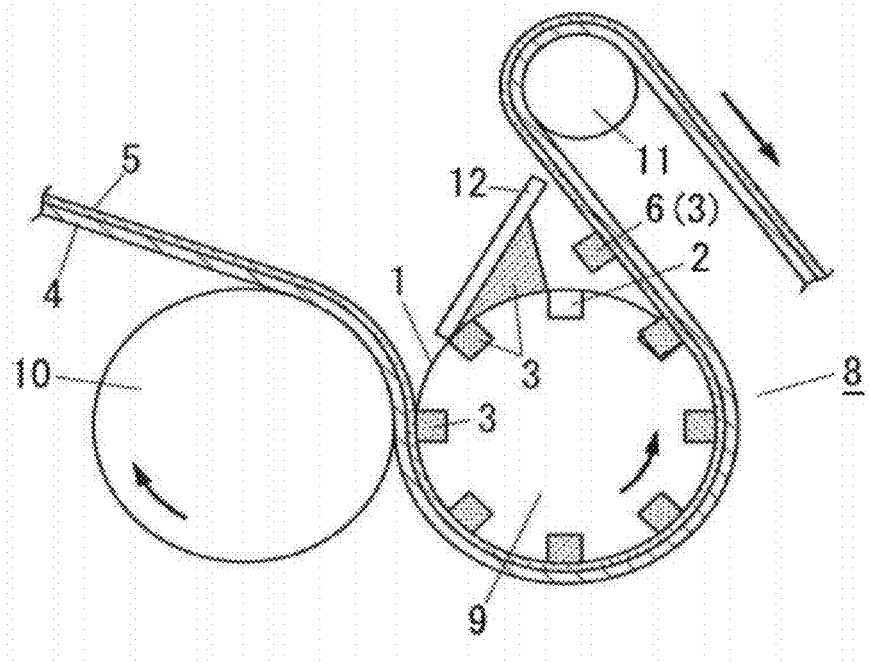

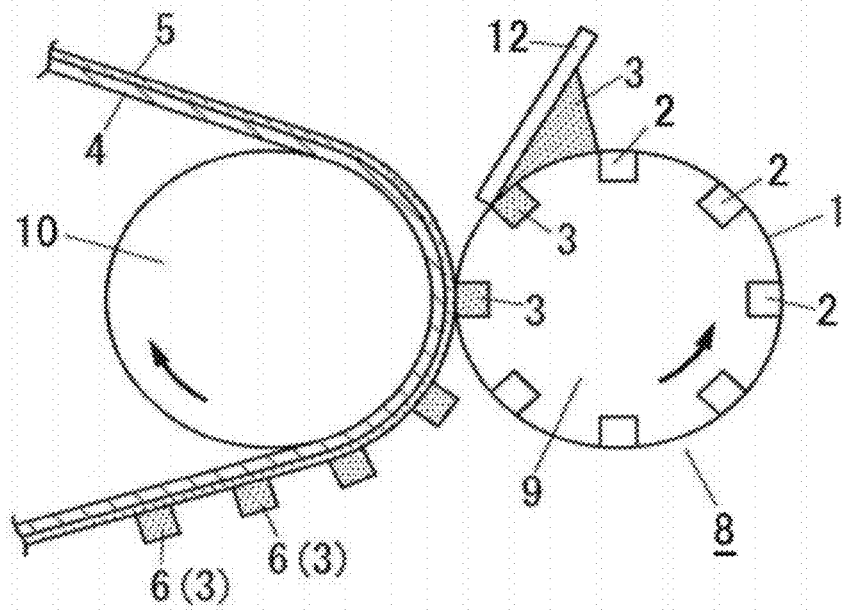

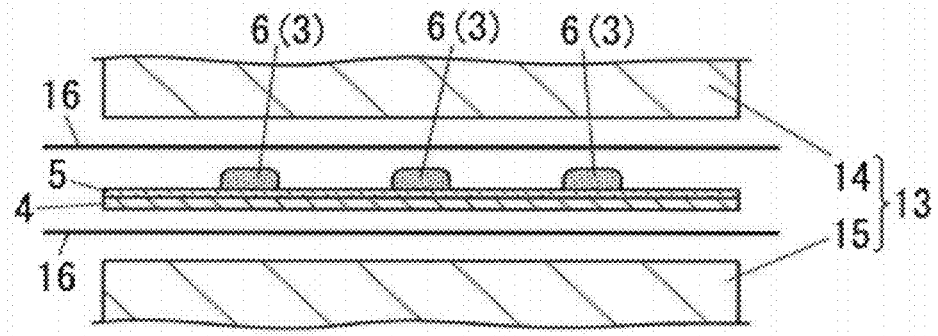
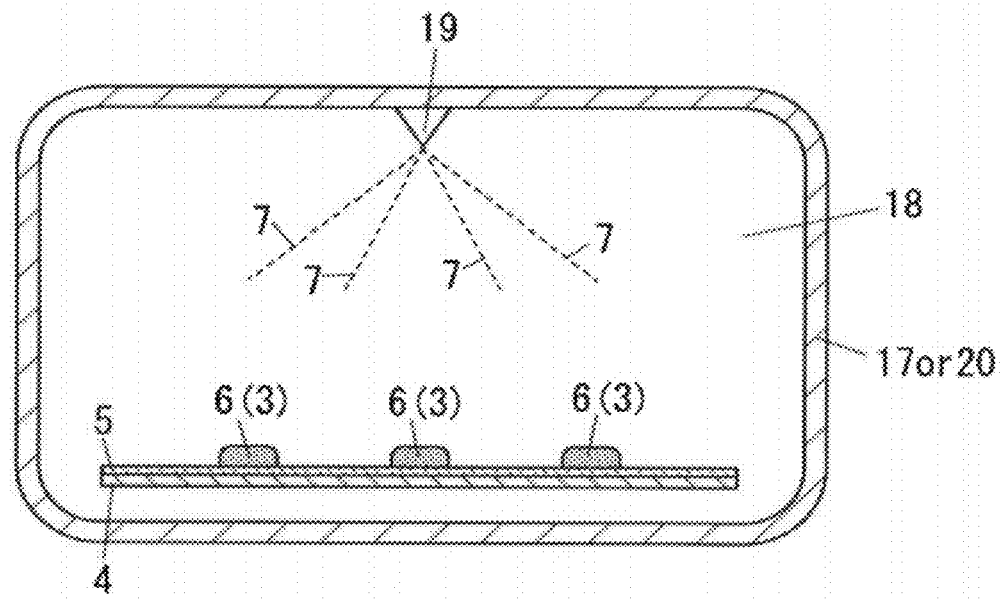

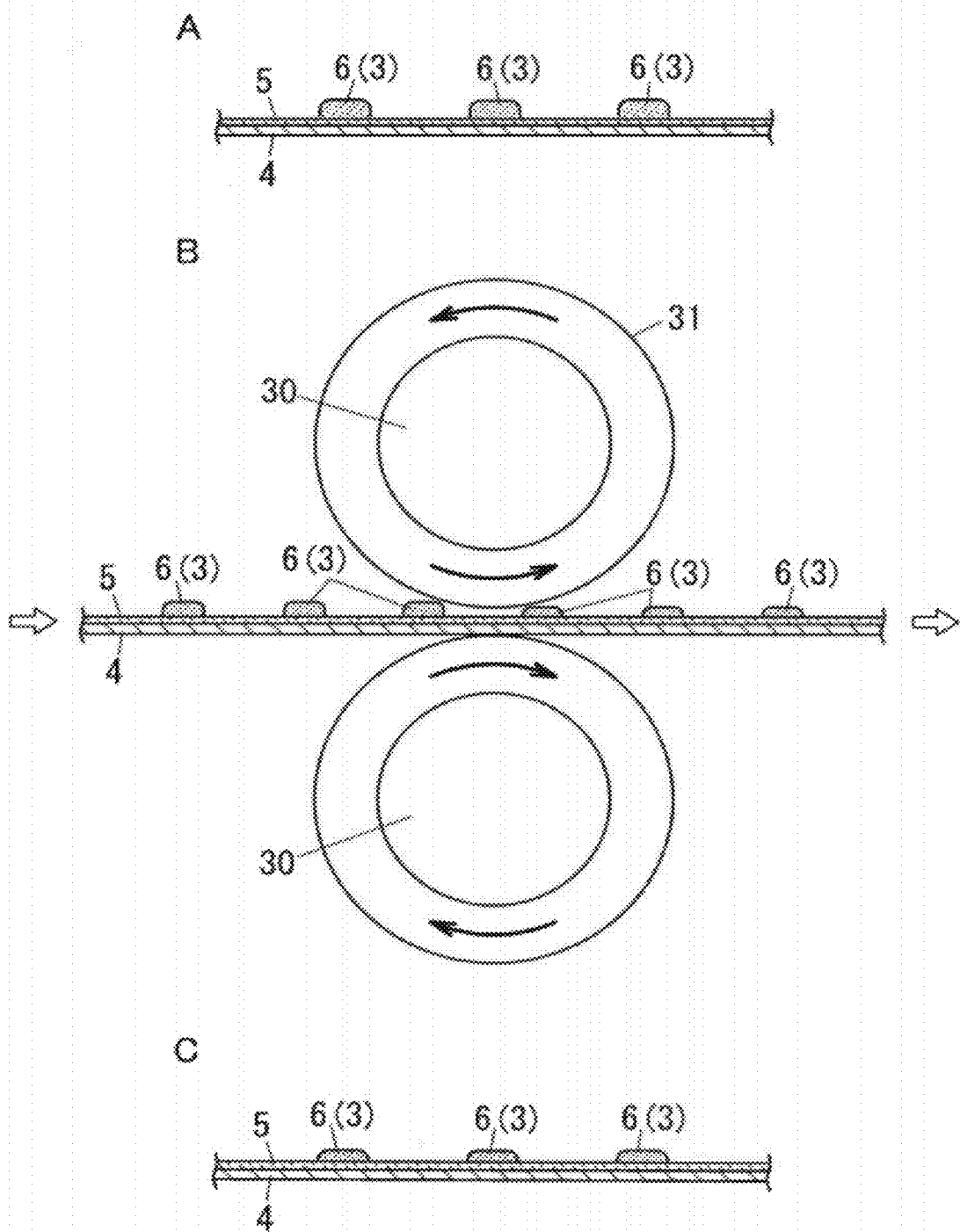

FIG. 10
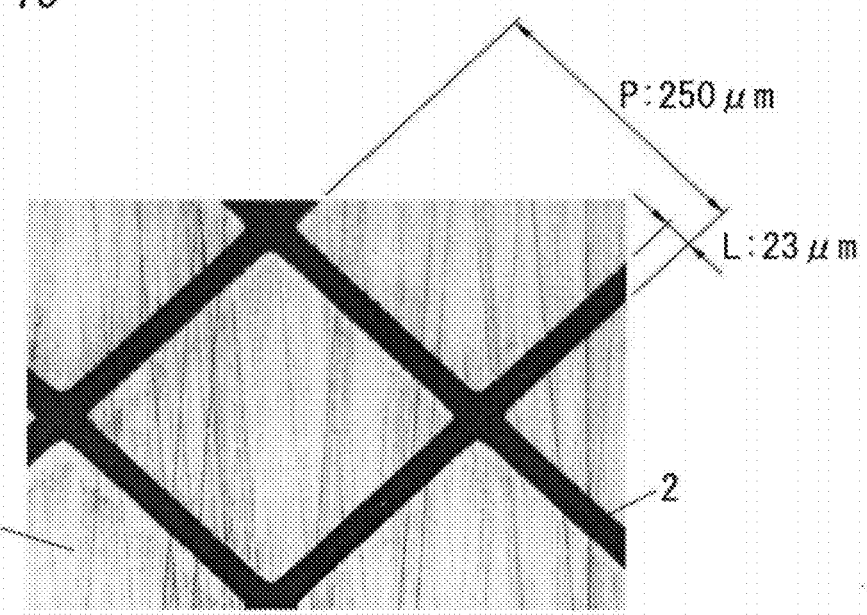
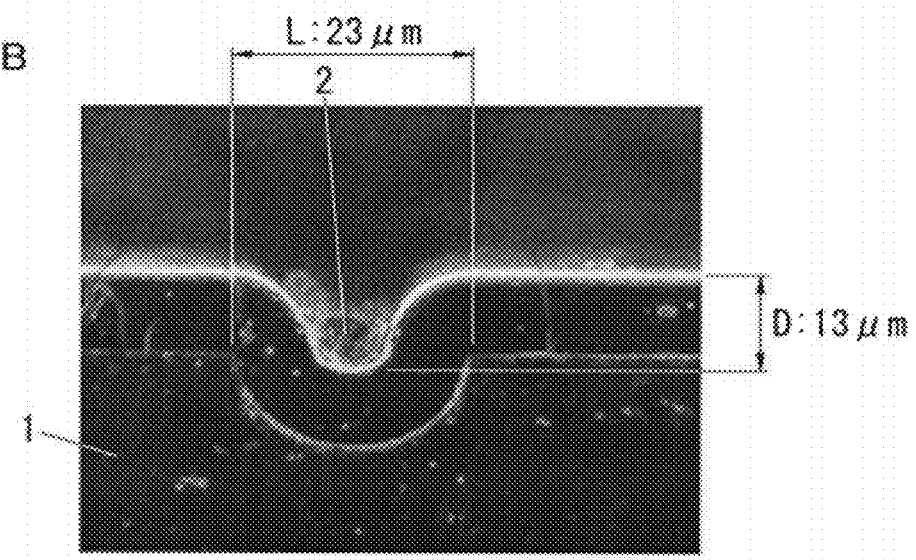

FIG. 11
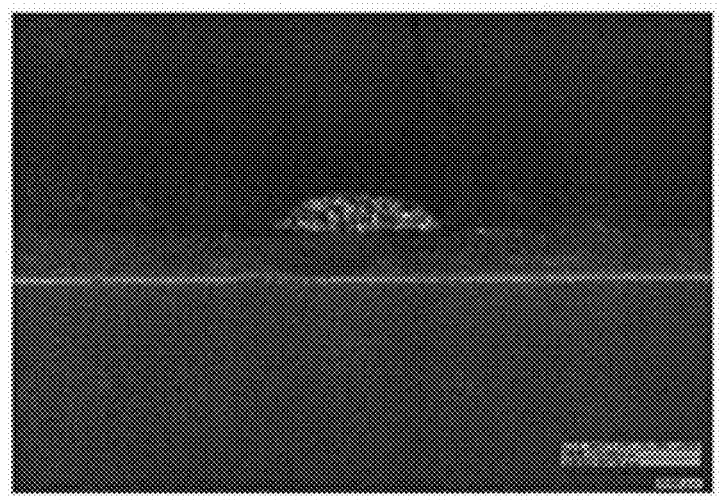
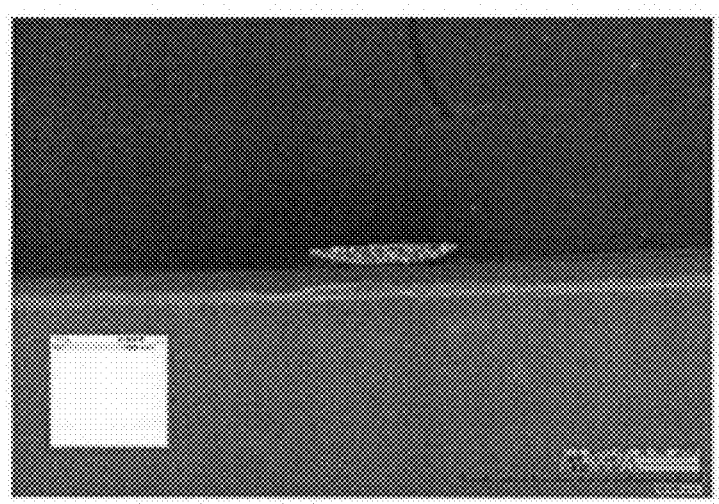
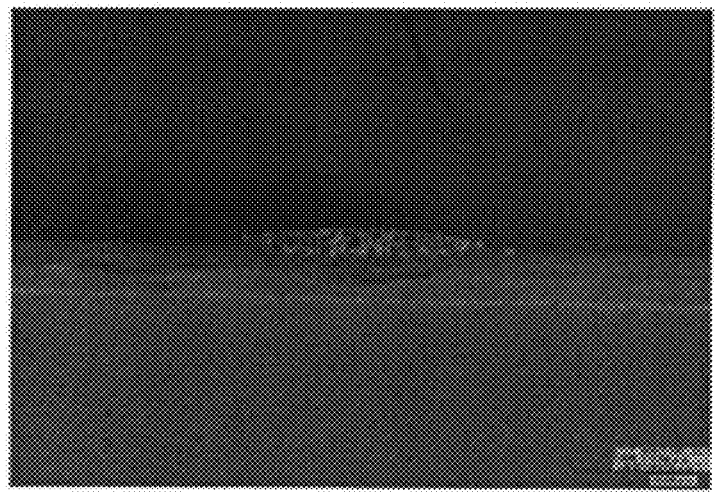

BASE MATERIAL WITH A CONDUCTOR PATTERN, AND A METHOD OF FORMING A BASE MATERIAL WITH A CONDUCTOR PATTERN

This application is a 371 of PCT/JP2010/069077 Oct. 27, 2010.

TECHNICAL FIELD

The invention relates to a base material with a conductor pattern formed thereon which is obtained by forming on a base material a conductor pattern such as a circuit pattern for a printed circuit board, an electrode pattern for a solar cell, a touch panel or an organic electroluminescent (EL) device, an antenna pattern for a TV or a GPS device, or an electromagnetic shielding pattern for an electromagnetic shielding material. The invention also relates to a method of forming the same.

BACKGROUND ART

Intaglio printing processes such as gravure printing have hitherto been used to form conductor patterns such as electromagnetic shielding patterns in electromagnetic shielding materials for use in, e.g., plasma display panels (PDP) (see, for example, Patent Documents 1 to 8). One such example, the transparent base material with electromagnetic shielding film described in Patent Document 1, is manufactured by forming an underlayer over the entire top side of a transparent base material; using a gravure printing process to form on the underlayer a catalyst ink layer in a predetermined pattern; then using a plating process to form on the catalyst ink layer a metal layer of the same pattern shape as the catalyst ink layer.

Here, the underlayer is formed using a material containing, for example, oxide fine particles and an organic polymer; a porous structure is thought to form on account of the presence of the oxide fine particles. The catalyst ink layer is formed using a catalyst ink containing, for example, noble metal fine particle-supporting oxide fine particles, an organic polymer and an organic solvent. When the catalyst ink layer is formed on the underlayer by a gravure printing process, as shown in FIG. 13, first, the organic solvent within the catalyst ink 23 that has been filled into the pattern grooves 22 on the plate cylinder 21 is absorbed into the porous underlayer 24, as a result of which the viscosity of the catalyst ink 23 rises. Apparently, the catalyst ink 23 which has hardened to an appropriate degree grips the porous underlayer 24, enhancing adherence between the catalyst ink 23 and the underlayer 24 by an anchoring effect, and the catalyst ink 23 is pulled from the pattern grooves 22 on the plate cylinder 21. In FIG. 13, "12" represents a doctor for scraping off excess catalyst ink 23, "25" is a transparent base material, and the arrows indicate the direction of flow by the organic solvent.

PRIOR-ART DOCUMENTS

Patent Documents

Patent Document 1: Japanese Patent Application Laid-open No. 2007-281290
Patent Document 2: Japanese Patent Application Laid-open No. 2008-211010
Patent Document 3: Japanese Patent Application Laid-open No. 2008-300724
Patent Document 4: Japanese Patent Application Laid-open No. 2009-004617
Patent Document 5: Japanese Patent Application Laid-open No. 2009-076827
Patent Document 6: Japanese Patent Application Laid-open No, H11-170420
Patent Document 7: Japanese Patent Application Laid-open No. 2009-177108
Patent Document 8: Japanese Patent Application Laid-open No. 2008-283008

SUMMARY OF THE INVENTION

Problems to be Solved by the Invention

However, in conventional conductor pattern forming methods, when the contact time between the catalyst ink 23 and the underlayer 24 is too long, the organic solvent in the catalyst ink 23 is excessively absorbed into the underlayer 24, as a result of which the catalyst ink 23 becomes too hard, making it difficult to pull all the catalyst ink 23 out of the pattern groves 22 in the plate cylinder 21. Consequently, conductor pattern 6 formation occurs in which only the catalyst ink 23 in shallow areas of the pattern grooves 22 is transferred to the underlayer 24. Compared to the conductor pattern 6 formed when all the catalyst ink 23 filled into the pattern grooves 22 is transferred, the resulting conductor pattern 6 has a high surface resistivity and a low conductivity.

Moreover, in conventional conductor pattern forming methods, because sufficient conductivity is not obtained with a catalyst ink layer alone, it is necessary to form a metal layer on the catalyst ink layer, as a result of which the productivity declines.

In light of the above, the object of this invention is to provide a base material with a conductor pattern formed thereon, wherein a conductor pattern having a lower surface resistivity and a higher conductivity than in the related art has been formed at a high productivity on a base material.

Means for Resolving the Problems

The base material with a conductor pattern formed thereon according to the present invention includes a base material, a receiving layer formed on the base material, and a conductor pattern formed on the receiving layer. The receiving layer is made of a cellulose acetate alkylate. The conductor pattern is formed of a conductive paste having a predetermined shape.

In the inventive base material with a conductor pattern formed thereon, it is preferable for the conductor pattern to have a conductor thickness of 0.5 μm and more.

In the inventive base material with a conductor pattern formed thereon, it is preferable for 10% and more of the conductor thickness of the conductor pattern to be embedded in the receiving layer.

In the inventive base material with a conductor pattern formed thereon, it is preferable for the cellulose acetate alkylate used to be at least one selected from among cellulose acetate butyrate, cellulose acetate propionate and cellulose acetate propionate butyrate.

In the inventive base material with a conductor pattern formed thereon, it is preferable for the conductor pattern to be formed by heat-treating the conductive paste with steam.

In the inventive base material with a conductor pattern formed thereon, it is preferable for the conductor pattern to be formed by pressing the conductive paste.

In the inventive base material with a conductor pattern formed thereon, it is preferable for the conductor pattern to be formed by pressing the conductive paste in a heated state with a roller.

The method of forming a base material with a conductor pattern thereon according to the present invention includes the steps of: providing a base material; forming a receiving layer made of a cellulose acetate alkylate on the base material; and forming a conductor pattern by arranging a conductive paste in a predetermined shape on the receiving layer.

In the inventive method, it is preferable for the conductor pattern to be formed to a thickness of 0.5 µm and more.

In the inventive method, it is preferable for the conductor pattern to be formed on the receiving layer in such a way that at least 10% of the conductor thickness lies at or inward of a surface of the receiving layer.

In the inventive method, it is preferable for the cellulose acetate alkylate to be at least one selected from among cellulose acetate butyrate, cellulose acetate propionate and cellulose acetate propionate butyrate.

In the inventive method, it is preferable for the conductor pattern to be formed by heat-treating the conductive paste with steam.

In the inventive method, it is preferable for the conductor pattern to be formed by pressing the conductive paste.

In the inventive method, it is preferable for the conductor pattern to be formed by pressing the conductive paste in a heated state with a roller.

Effects of the Invention

In the base material with a conductor pattern formed thereon according to this invention, the cellulose acetate alkylate making up the receiving layer swells upon absorbing the solvent within the conductive paste, exhibiting tack. Because the receiving layer pulls the conductive paste from recesses on the intaglio printing plate by means of this tack, the conductor thickness can be made larger than in the conventional art, enabling a conductor pattern having a lower surface resistivity and a higher conductivity to be formed at a high productivity.

BRIEF DESCRIPTION OF THE DRAWINGS

FIG. 1 is a schematic cross-sectional diagram showing an example of a gravure printing press.

FIG. 2 is a schematic cross-sectional diagram showing another example of a gravure printing press.

FIG. 3 is a schematic cross-sectional diagram showing yet another example of a gravure printing press.

FIG. 5 is a schematic cross-sectional view showing another example of a conductor pattern forming method.

FIG. 6 is a schematic cross-sectional view showing yet another example of a conductor pattern forming method.

FIG. 7 is a schematic cross-sectional view showing a further example of a conductor pattern forming method.

FIG. 10 shows an example of an intaglio printing plate, FIG. 10A being an electron micrograph of the surface and FIG. 10B being an electron micrograph of a recess cross-section.

FIG. 11 presents images captured with a digital microscope (KH-7700, from Hirox-Japan Co., Ltd.), FIG. 11A showing a cross-section of the conductor pattern obtained in Example 1, FIG. 11B showing a cross-section of the conductor pattern obtained in Example 4-2, and FIG. 11C showing a cross-section of the conductor pattern obtained in Example 18.

BEST MODE FOR CARRYING OUT THE INVENTION

Figure 4:
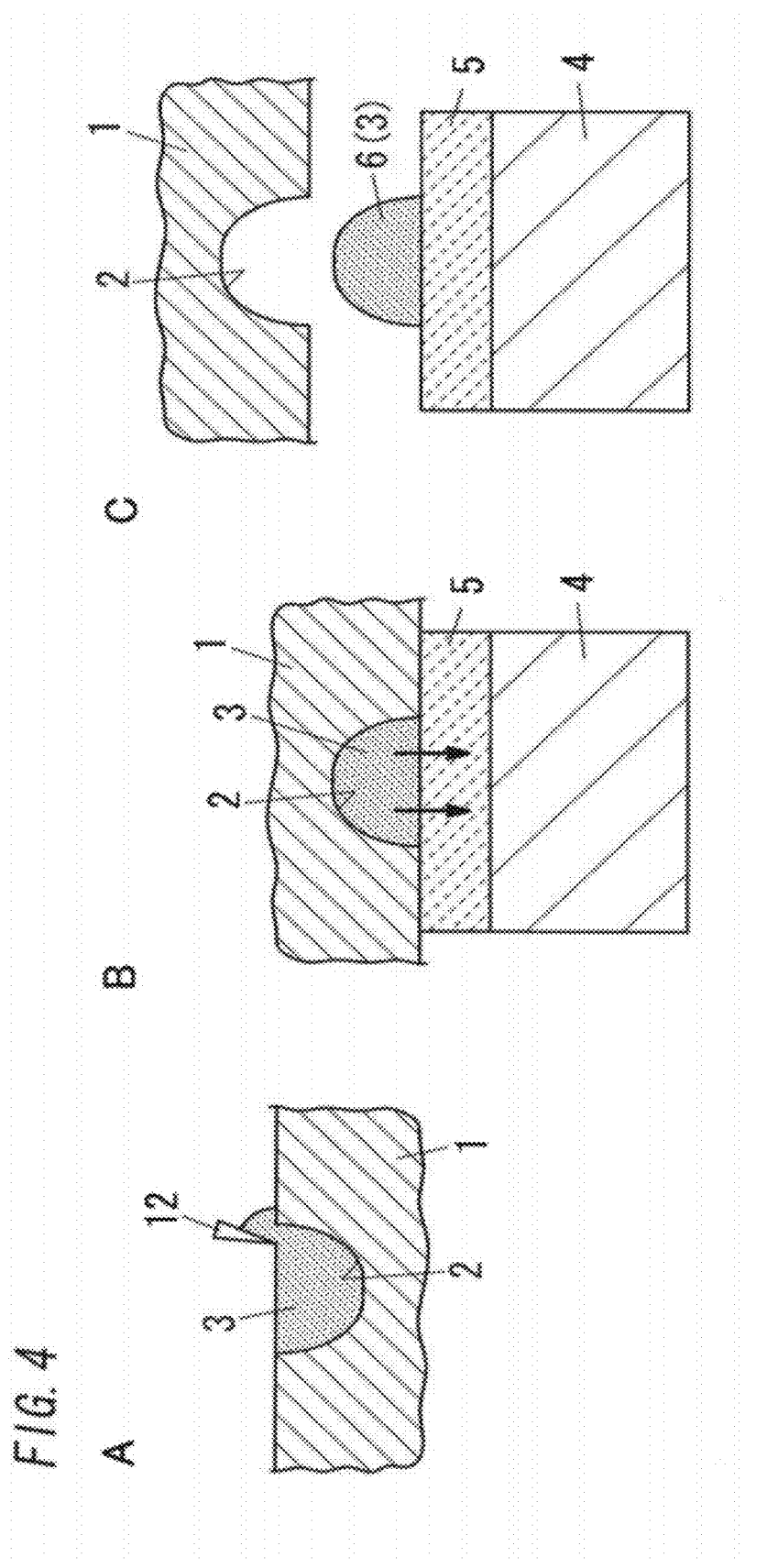
FIG. 4 shows an example of a method of forming a conductor pattern, FIGS. 4A to 4C being enlarged schematic cross-sectional views depicting details of the method.

Embodiments of the invention are described below.

In the invention, a sheet-like or plate-like material, such as a polyethylene terephthalate film (PET film) or some other organic resin base formed of, for example, an acrylic resin such as polymethyl methacrylate, a polyester resin such as polyethylene terephthalate, polybutylene terephthalate or polyethylene naphthalate, a norbornene resin such as those available under the trade name "Arton" from JSR Corporation or an olefin maleimide resin such as those available under the trade name "TI-160" from Tosoh Corporation; a glass base formed of glass; or the epoxy resin base material described in Japanese Patent Application Laid-open No. H08-148829 may be used as the base material 4. Moreover, the base material 4 may be used in short lengths, although use in continuous lengths is preferred because, as shown in the subsequently described FIGS. 7 and 8, the base material 4 on which a conductive paste 3 has been printed can be continuously pressed with rollers 30. The base material 4 has a thickness of preferably from 1 µm to 20 mm, more preferably from 10 µm to 1 mm, and even more preferably from 25 µm to 200 µm.

Next, a receiving layer 5 (undercoat layer) made of a cellulose acetate alkylate is formed on the surface of the aforementioned base material 4. The receiving layer 5 which has been formed of the cellulose acetate alkylate absorbs solvent within the subsequently described conductive paste 3 and swells, and is thereby able to manifest tack. It is especially preferable to use at least one selected from among cellulose acetate butyrate, cellulose acetate propionate and cellulose acetate propionate butyrate as the cellulose acetate alkylate. When such a cellulose acetate alkylate is used, a powerful tack can easily be manifested in the receiving layer 5 compared with cases in which other cellulose acetate alkylates are used. The number-average molecular weight of the cellulose acetate alkylate is preferably from 1,000 to 200,000, and more preferably from 5,000 to 100,000. At a cellulose acetate alkylate number-average molecular weight of less than 1,000, the tack weakens and it may not be possible to form a conductor pattern having a high aspect ratio (conductor thickness/conductor width). Conversely, at a cellulose acetate alkylate number-average molecular weight in excess of 200,000, the solubility decreases, as a result of which tack may not readily appear. When forming the receiving layer 5 on the surface of the base material 4, first a receiving layer-forming solution is prepared by dissolving the cellulose acetate alkylate in a solvent such as methyl isobutyl ketone (MIBK). The content of the cellulose acetate alkylate at this time will vary depending on the number-average molecular weight, although a content, based on the total amount of the receiving layer-forming solution, of from 0.1 to 50 wt % is preferred, and a content of from 2 to 30 wt % is more preferred. Next, the receiving layer-forming solution is coated onto the surface of the base material 4 using a microgravure coater or the like, following which the solvent is removed and the molecular weight is increased by heating and drying at 60 to 200° C. for a period of from 1 second to 30 minutes, thereby forming a receiving layer 5 on the surface of the base material 4. The thickness of the receiving layer 5 at this time is preferably from 0.01 to 50 μm. When thickness of a receiving layer 5 is formed less than 0.01 μm, a tack to pull the conductive paste 3 from the recesses 2 in the subsequently described intaglio printing plate 1 may not be obtained sufficiently. On the other hand, at a thickness in excess of 50 μm, formation of the receiving layer 5 by coating may be difficult and the surface smoothness may decline.

In conventional conductor pattern forming methods such as that described in above-referenced Patent Document 1, for example, because oxide fine particles are included in the underlayer, the surface area of contact between the catalyst ink and the underlayer decreases, presumably making it more difficult for tack to appear. Accordingly, in the present invention, oxide fine particles may be included in the receiving layer 5 within a range that does not adversely affect the emergence of tack. Specifically, the content of oxide fine particles is preferably less than 10 wt %, and more preferably less than 3 wt %. To the extent possible, the inclusion of no oxide fine particles is most preferred.

The conductive paste 3 used may be prepared from, for example, a metal powder, a metal oxide powder such as antimony-tin oxide or indium-tin oxide, metal nanowire, graphite, carbon black, thermoplastic resin, additives and solvents. Examples of metal powders that may be used include any selected from among silver powder, copper powder, nickel powder, aluminum powder, iron powder, magnesium powder and alloy powders thereof, or any of these powders coated with one or more layer of a different metal. Examples of metal nanowires that may be used are indicated as gold, silver, copper, and platinum nanowire. These are included in amounts, based on the total amount of the conductive paste 3, of preferably from 0 to 99 wt %, and an amount of from 50 to 99 wt % is more preferred from the standpoint of ease of use and conductivity. The amount of carbon black and graphite included is preferably from 0 to 99 wt %, and an amount of carbon black and graphite included from 0.01 to 20 wt % is more preferable from the standpoint of ease of use and the degree of blackness. At least one from among metal powders, metal nanowires, carbon black and graphite is used. Examples of thermoplastic resins that may be used are indicated as vinyl resins, polyester resins, acrylic resins, derivatives of these resins containing —COC— skeleton or —COO— skeleton, and cellulose derivatives such as carboxymethyl cellulose, acetyl cellulose and cellulose acetate butyrate. The compounding amount of thermoplastic resin is preferably from 0.1 to 20 wt %. Examples of additives which may be used are indicated as foam inhibitors/leveling agents such as "BYK333 (a silicone oil)" available from BYK Japan KK. The compounding amount of the additives is preferably from 0 to 10 wt %. Examples of solvents which may be used are indicated as methanol, ethanol, isopropyl alcohol (IPA), methyl ethyl ketone (MEK), methyl isobutyl ketone (MIBK), toluene, ethyl acetate, cyclohexanone, xylene, diethylene glycol monoethyl ether acetate, dipropylene glycol monomethyl ether, 1-(2-methoxy-2-methylethoxy)-2-propanol, propylene glycol monomethyl ether acetate, 2-phenoxyethanol and water, either independently or as a mixed solvent in which these are mixed in any ratio. The amount of solvent included is preferably from 0.1 to 50 wt %.

The intaglio printing plate 1 may be, for example, a copper plate on a surface of which recesses 2 have been formed in a predetermined pattern shape. It is preferable here for the recesses 2 to have a depth of 0.5 μm and more (the upper limit being 1 mm) and a width of 1 mm and less (the lower limit being 0.5 μm). This enables a fine conductor pattern 6 having a conductor thickness of 0.5 μm and more (upper limit, 1 mm) and a conductor width of 1 mm and less (lower limit, 0.5 μm) to be easily formed. Because such a conductor pattern 6 has a higher aspect ratio (conductor thickness/conductor width) than in the conventional art, the result is a narrower conductor width (finer line) having a low surface resistivity and a high conductivity. In particular, such a conductor pattern 6, in the various subsequently described treatments such as pressing, steam heating, and steam heating/pressing, further lowers the surface resistivity and further increases the conductivity. The predetermined pattern shape is not subject to any particular limitation. For example, any pattern shape may be used in cases where a circuit pattern for a printed circuit board, an electrode pattern for a solar cell, touch panel or organic EL device, or an antenna pattern for a TV or a GPS device is to be formed. When manufacturing an electromagnetic shielding material to be employed in a plasma display or the like, a grid-like or mesh-like electromagnetic shielding pattern like that shown in FIG. 9 may be used.

Printing may be carried out by employing, for example, gravure printing, offset printing or screen printing. Of these, it is preferable to carry out printing by a high-productivity intaglio process such as gravure printing. FIGS. 1 and 2 show examples of a gravure printing press 8 provided with a plate cylinder 9, an impression cylinder 10 and a supporting roller 11, all of which are cylindrical. An intaglio printing plate 1 is set in place by being wrapped around the plate cylinder 9 with the side thereof on which recesses have been formed facing outward. While the plate cylinder 9 is being rotated, a conductive paste 3 is supplied to and filled into the recesses 2 on the outer surface thereof and surplus conductive paste 3 is scraped off with a doctor 12 (see FIG. 4A). A base material 4 is passed between the plate cylinder 9 and the impression cylinder 10 by the impression cylinder 10 which rotates in the opposite direction to the plate cylinder 9, in such a way that a side thereof on which a receiving layer has been formed comes into contact with the outer surface of the plate cylinder 9, wraps around the plate cylinder 9 for about one-half (see FIG. 1) to three-quarters (see FIG. 2) of the circumference thereof and, by bringing the side of the intaglio printing plate 1 in which recesses have been formed into contact with the receiving layer side of the base material 4 (see FIG. 4B) for 0.5 second and more (the upper limit being 60 seconds), the conductive paste 3 is printed in a predetermined pattern shape onto the receiving layer side of the base material 4 (see FIG. 4C). By thus bringing the side of the intaglio printing plate 1 in which recesses have been formed into contact with the receiving layer side of the base material 4 for at least 0.5 second, the cellulose acetate alkylate of which the receiving layer 5 is made fully swells due to the solvent in the conductive paste 3, resulting in the appearance of tack (stickiness). Due to this tack, the receiving layer 5 is able to efficiently pull the conductive paste 3 from the recesses 2 in the intaglio printing plate 1. At this time, in order to obtain a higher conductor thickness, the contact time between the side of the intaglio printing plate 1 having recesses and the receiving layer side of the base material 4 is preferably 1 second and more, and more preferably, the contact time indicated above is 2 seconds and more. The conductive paste 3 which has been pulled out is dried together with the receiving layer 5 and the solvent is removed, thereby forming a conductor pattern 6. This conductor pattern 6 has a conductor thickness which is preferably 50% and more (upper limit, 100%) of the depth of the recesses 2 in the intaglio printing plate 1. Accordingly, by using in particular an intaglio printing plate 1 on the surface of which recesses 2 having a high aspect ratio (depth/width) are formed, it is possible to make the conductor thickness larger and the conductor width narrower than in the conventional art. As a result, a conductor pattern 6 having an increased aspect ratio (conductor thickness/conductor width), and thus a low surface resistivity and a high conductivity, can be formed at a high productivity. In FIG. 4, the arrows indicate the direction of flow by the solvent.

If the contact time between the side of the intaglio printing plate 1 on which recesses have been formed and the receiving layer side of the base material 4 is less than 0.5 second, the cellulose acetate alkylate making up the receiving layer 5 may be unable to express sufficient tack. As a result, it may not be possible to pull the conductive paste 3 from the recesses 2 on the intaglio printing plate 1 or, even if such pulling is possible, the conductor pattern 6 may have a conductor thickness which is less than 50% the depth of the recesses 2 in the intaglio printing plate 1, lowering the aspect ratio.

Next, the base material 4 on which the conductive paste 3 has been printed is wrapped, with the printed face outward, around the periphery of the supporting roller 11 which rotates in the opposite direction to the plate cylinder 9, then is transported to a drying step (not shown) in order to remove the solvent from the conductive paste 3 and the receiving layer 5. Upon completion of the drying step, a conductor pattern-bearing base material (e.g., a printed circuit board or an electromagnetic shielding material) in which a conductor pattern 6 has been formed on a base material 4 can be obtained. The contact time between the side of the intaglio printing plate 1 on which recesses have been formed and the receiving layer side of the base material 4 can be regulated by changing the transport speed of the base material 4 or by adjusting the position of the supporting roller 11 as shown in FIGS. 1 and 2 so as to change the extent to which the base material 4 is wrapped around the plate cylinder 9.

According to one preferred embodiment of the invention, the conductive paste 3 which has been printed in a predetermined pattern shape onto the surface of the receiving layer 5 of the base material 4 is dried by heating at 50 to 150° C. for a period of from 0.1 to 180 minutes, then pressed using a heating and pressing apparatus 13 as shown in FIG. 5 to form a conductor pattern 6. The heating and pressing apparatus 13 used may be equipped with a pair of hot platens 14, 15 which can be moved closer together or further apart and which have flat, mutually opposed surfaces formed thereon. When the conductor pattern 6 which has been formed as described above is compressed under pressing, the surface area of contact between the conductive fine particles of the metal powder and the like increases, as a result of which the surface resistivity becomes lower and the conductivity becomes higher than in conventional conductor patterns. Here, pressing is carried out at preferably 50 to 150° C. and 0.01 to 200 kgf/cm$^2$ (0.98 kPa to 19.6 MPa) for 0.1 to 180 minutes, and more preferably 80 to 150° C. and 1 to 50 kgf/cm$^2$ (98 kPa to 4.9 MPa) for 0.1 to 60 minutes. After the heating and pressing has been completed, rapid cooling with water or the like, such as cooling until 40° C. from 110° C. for 30 minutes, while maintaining the pressure is effective for maintaining the compressed state of the conductive paste 3. When pressing is carried out, release sheets 16 may be interposed between the base material 4 onto which the conductive paste 3 has been printed and the hot platens 14, 15 as shown in FIG. 5. Examples of such release sheets 16 that may be used are indicated as polyester films, polyester films coated with a release agent such as a silicone resin to provide a release agent layer, and known polarizing plates.

According to another embodiment, the conductive paste 3 which has been printed in a predetermined pattern shape onto the surface of the receiving layer 5 on the base material 4 is dried by heating at 50 to 150° C. for a period of from 0.1 to 180 minutes, and is then heat-treated with steam 7 using a steam heating apparatus 17 such as that shown in FIG. 6 to form the conductor pattern 6. Here, the steam heating apparatus 17 is provided with a steam jet unit 19 which sprays high-temperature steam 7 into a treatment chamber 18. After the conductive paste 3 has been dried, the base material 4 is placed within the treatment chamber 18 and heat treatment with steam 7 (steam heating treatment) can be carried out by spraying steam 7 from the steam jet unit 19. When the conductor pattern 6 that has been formed is heat-treated by steam 7 in this way, binder resin ingredients such as thermoplastic resin flow out from between the conductive fine particles such as metal powder and are discarded, and the surface area of contact between the conductive fine particles increases, as a result of which the conductor pattern has a lower surface resistivity and a higher conductivity than conventional conductor patterns. Here, steam heating treatment is preferably carried out at 40 to 200° C. and 50 to 100% humidity for 0.0001 to 100 hours, and is more preferably carried out at 70 to 150° C. and 70 to 99% humidity for 0.01 to 100 hours.

Steam heating treatment is preferably carried out while applying pressure as in FIG. 6. In this case, use may be made of a steam heating and pressing apparatus 20. This steam heating and pressing apparatus 20 is provided with a steam jet unit 19 which sprays high-temperature steam 7 into a treatment chamber 18 formed of a pressure vessel, and pressing means (not shown) which applies pressure within the treatment chamber 18. The base material 4 after the conductive paste 3 has been dried is placed within the treatment chamber 18 and, by spraying steam 7 from the steam jet unit 19 and also applying pressure by the pressing means within the treatment chamber 18, steam heating treatment can be carried out while pressing. In addition to the effect obtained by steam heating treatment, because the conductor pattern 6 thus formed is also pressed, the outflow and discarding of binder resin ingredients such as thermoplastic resin from between the conductive fine particles such as metal powder is accelerated, making it possible to efficiently form the conductor pattern 6 in a short time. Moreover, conductive fine particles such as metal powder within the conductive paste 3 mutually aggregate, enabling the surface resistivity to be further lowered. Here, the heat treatment using steam 7 and accompanied by the application of pressure (steam heating and pressing treatment) is preferably carried out at 30 to 200° C., 50 to 100% humidity and 0.01 to 200 kgf/cm$^2$ (0.98 kPa to 19.6 MPa) for 0.0001 to 50 hours, and is more preferably carried out at 70 to 150° C., 70 to 99% humidity and 1 to 50 kgf/cm$^2$ (98 kPa to 4.9 MPa) for 0.01 to 50 hours.

According to yet another embodiment, the conductive paste 3 which has been printed in a predetermined pattern shape onto the receiving layer 5 of a base material 4 is dried as shown in FIG. 7A by heating at 50 to 150° C. for 0.1 to 180 minutes, following which heating is carried out at a temperature of 120 to 150° C. with hot air, infrared radiation (IR) or the like, then, using a roll pressing apparatus 31 as shown in FIG. 7B, the base material 4, receiving layer 5 and conductive paste 3 are pressed in a warmed state with rollers 30 so as to form a conductor pattern 6 like that shown in FIG. 7C. By thus heating the base material 4, receiving layer 5 and conductive paste 3 before pressing with the rollers 30, the receiving layer 5 becomes soft and the printed conductive paste 3 does not widen out during pressing with the rollers 30, making it possible to obtain a conductor pattern 6 having a narrow conductor width and thus enabling a lower resistivity to be achieved. Heating for the purpose of drying and subsequent heating may be carried out successively without interruption, or heating for drying may be carried out, after which the workpiece may be left to cool, then heated once again. Here, the roll pressing apparatus 31 used may be one in which, for example, two rollers 30 capable of rotation are arranged so as to be parallel and mutually opposed. The dimensions of the respective rollers 30 are not subject to any particular limitation, although heated rollers made of rubber or steel are preferred. Pressing with the rollers 30 may be carried out by continuously passing and transporting between the two rollers 30 a continuous length of base material 4 on which the conductive paste 3 has been printed. Just before being pressed by the rollers 30, it is preferable for the base material 4 on which the conductive paste 3 has been printed to be warmed by heating at from 60 to 400° C. (more preferably from 70 to 200° C.) for a period of from 0.5 second to 1 hour (more preferably from 5 seconds to 30 minutes). The temperature of heating by the rollers 30 is preferably set to from 60 to 400° C. (more preferably from 70 to 200° C.), the pressing pressure is preferably set to from 0.1 to 400 kgf/cm$^2$ (0.01 to 39.2 MPa) (more preferably, from 0.5 to 200 kgf/cm$^2$ (0.05 to 19.6 MPa)), and the speed at which the base material 4 passes between the two rollers 30 is preferably set to from 0.5 to 30 m/min. If the temperature of heating by the rollers 30 is less than 60° C., the conductive paste 3 may not sufficiently harden; on the other hand, if the temperature exceeds 400° C., the base material 4 may incur thermal damage. If the pressing pressure by the rollers 30 is less than 0.5 kgf/cm$^2$ (0.05 MPa), it may not be possible to adequately lower the surface resistivity of the conductor pattern 6. On the other hand, if the pressure exceeds 400 kgf/cm$^2$ (39.2 MPa), the conductor width of the conductor pattern 6 may widen excessively, as a result of which neighboring conductor patterns 6 which must be kept insulated from one another may come into direct contact. If the speed at which the base material 4 passes between the two rollers 30 is less than 0.5 m/min, it may not be possible to rapidly form a conductor pattern 6. On the other hand, if the speed exceeds 30 m/min, the pressing time becomes too short, as a result of which it may not be possible to make the surface resistivity of the conductor pattern 6 sufficiently low. The clearance between the two rollers 30 should be suitably set so as to enable pressing under the above-indicated pressure.

Because the conductor pattern 6 formed as described above is then compressed by pressing with the rollers 30, thereby increasing the contact surface area between the conductive fine particles such as metal powder, the surface resistivity becomes lower and the conductivity becomes higher than in conventional conductor patterns. Moreover, because the pressing in this case is not carried out intermittently with a batch-type pressing apparatus (one that is provided with a pair of pressing plates that move closer together or further apart), but rather is carried out without interruption using a continuous roll pressing apparatus 31, the conductor pattern 6 can be rapidly formed. As a result, the fabrication speed for printed circuit boards, electromagnetic shielding materials and the like can be increased. When pressing with the rollers 30, release sheets (not shown) may be interposed between the base material 4 onto which the conductive paste 3 has been printed and the rollers 30. Examples of such release sheets that may be used are indicated as polyester films, polyester films coated with a release agent such as a silicone resin to provide a release agent layer, and known polarizing plates.

Figure 8:
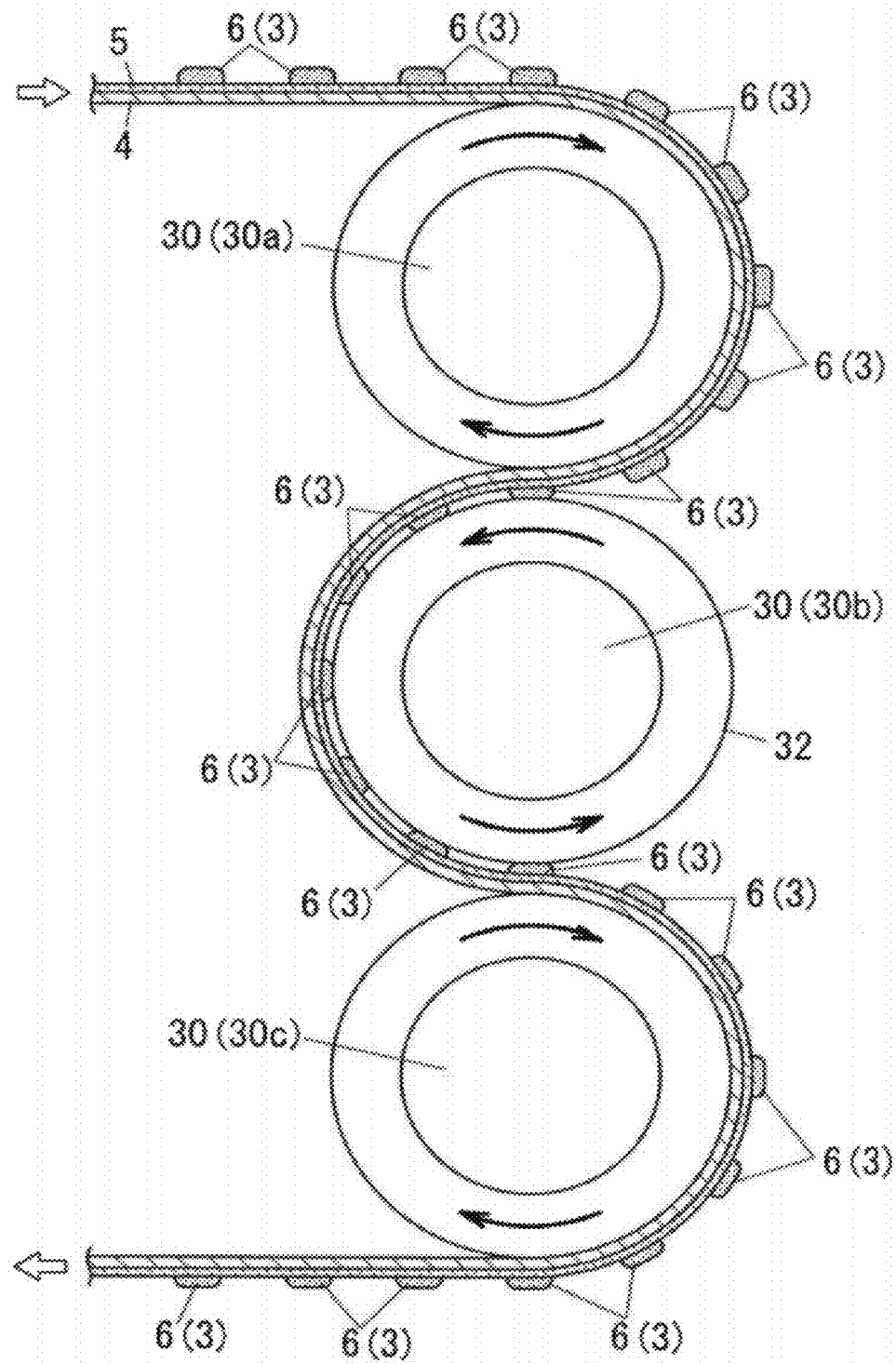
FIG. 8 is a schematic cross-sectional view showing a still further example of a conductor pattern forming method.

FIG. 8 shows another embodiment of the invention. In this case, pressing with rollers 30 is carried out a plurality of times using a multistage roll pressing apparatus 32 instead of the roll pressing apparatus shown in FIG. 7. The multistage roll pressing apparatus 32 used here may be, for example, an apparatus which uses three rollers 30, namely, a first roller 30$a$, a second roller 30$b$ and a third roller 30$c$, all of which are rotatable, with the first roller 30$a$ and the second roller 30$b$ being arranged so as to be parallel and mutually opposed, and the second roller 30$b$ and the third roller 30$c$ being arranged so as to be parallel and mutually opposed. The dimensions and materials of the respective rollers 30 are not subject to any particular limitation, although it is preferable for each of the rollers 30 to be a heated roller. Pressing with the rollers 30 may be carried out by first wrapping a continuous length of base material 4 on which the conductive paste 3 has been printed around the first roller 30$a$ for about one-half of the circumference thereof and in this manner passing it between the first roller 30$a$ and the second roller 30$b$, then wrapping the base material 4 around the second roller 30$b$ for about one-half of the circumference thereof and passing it between the second roller 30$b$ and the third roller 30$c$, and subsequently wrapping the base material 4 around the third roller 30$c$ for about one-half of the circumference thereof and continued transport. In the apparatus shown in FIG. 8, because wrapping of the base material 4 onto the first roller 30$a$ is carried out in such a way that the side opposite to the side on which the conductive paste 3 has been printed comes into contact with the outer peripheral face of the first roller 30$a$, wrapping of the base material 4 onto the second roller 30$b$ is carried out in such a way that the side on which the conductive paste 3 has been printed comes into contact with the outer peripheral face of the second roller 30$b$, and wrapping of the base material 4 onto the third roller 30$c$ is carried out in such a way that, as with wrapping onto the first roller 30$a$, the side opposite to the side on which the conductive paste 3 has been printed comes into contact with the outer peripheral face of the third roller 30$c$. In this way, pressing can be carried out while keeping the temperature constant. If the temperature is not kept constant, the printed conductive paste 3 will merely flatten when pressed, making a lower resistivity impossible to achieve. It is preferable to set the heating temperature via the respective rollers 30 at from 60 to 400° C. (preferably from 70 to 200° C.), the pressing pressure at from 0.1 to 400 kgf/cm$^2$ (0.01 to 39.2 MPa) (preferably from 0.5 to 200 kgf/cm$^2$ (0.05 to 19.6 MPa)), and the speed at which the base material 4 is passed between two of the rollers 30 at from 0.5 to 30 m/min. If the temperature of heating by the respective rollers 30 is less than 60° C., the conductive paste 3 may not fully harden. On the other hand, if the temperature is above 400° C., the base material 4 may incur thermal damage. If the pressing pressure by the respective rollers 30 is less than 0.1 kgf/cm$^2$ (0.01 MPa), it may not be possible to make the surface resistivity of the conductor pattern 6 sufficiently low. On the other hand, if the pressure exceeds 400 kgf/cm$^2$ (39.2 MPa), the conductor width of the conductor pattern 6 will widen excessively, as a result of which neighboring conductor patterns 6 which must be kept insulated from one another may come into direct contact. If the speed at which the base material 4 passes between two of the rollers 30 is less than 0.5 m/min, it may not be possible to rapidly form a conductor pattern 6. On the other hand, if the speed exceeds 30 m/min, the pressing time becomes too short, as a result of which it may not be possible to make the surface resistivity of the conductor pattern 6 sufficiently low. The clearance between the two rollers 30 should be suitably set so as to enable pressing under the above-indicated pressure. In the multistage roll pressing apparatus 32, the number of rollers 30 is not limited to three, and may be set to four or more.

In the foregoing case, pressing by the rollers 30 is carried out a total of two times: once between the first roller 30a and the second roller 30b, and once between the second roller 30b and the third roller 30c. The conductor pattern 6 which has been thus formed, by being compressed a plurality of times from pressing by the rollers 30, undergoes an increase in the contact surface area between conductive fine particles such as metal powder. As a result, compared with a conductor pattern 6 formed by a single compression from pressing by the rollers 30, the surface area resistivity becomes even lower and the conductivity becomes even higher. Moreover, because pressing in this case as well is not carried out intermittently with a batch type pressing apparatus (one that is provided with a pair of pressing plates that move closer together or further apart), but rather is carried out without interruption using a continuous multistage roll pressing apparatus 32, the conductor pattern 6 can be rapidly formed. As a result, the fabrication speed for printed circuit boards, electromagnetic shielding materials and the like can be increased. In this case as well, release sheets (not shown) may be interposed between the base material 4 onto which the conductive paste 3 has been printed and the rollers 30. Examples of such release sheets that may be used include polyester films, polyester films coated with a release agent such as a silicone resin to provide a release agent layer, and known polarizing plates.

Regardless of which of the above-described methods is used to produce the base material having a conductor pattern formed thereon, it is preferable for at least 10% (the upper limit being 100%) of the conductor thickness of the conductor pattern 6 to be embedded in the receiving layer 5; i.e., for at least 10% of the thickness of the conductor pattern 6 to lie at or inward of the surface of the receiving layer 5. Because the conductor pattern 6 is thus embedded within the receiving layer 5, a high adherence of the conductor pattern 6 to the receiving layer 5 can be obtained. Moreover, by embedding the conductor pattern 6 in the receiving layer 5, the surface of the base material having a conductor pattern formed thereon approaches a smooth state, with steps between the conductor pattern 6 and the receiving layer 5 becoming smaller. As a result, in cases where film formation by evaporative deposition, sputtering, coating or the like is carried out onto the surface of the base material having a conductor pattern formed thereon, the film layer can be easily formed. For similar reasons, when a pressure-sensitive adhesive or a heat-sealing adhesive is used to laminate another base material 4 onto the surface of the base material having a conductor pattern formed thereon, undesirable effects such as the inclusion of gas bubbles between the conductor-patterned base material and the other base material 4 do not readily arise.

As indicated above, the present invention is able to increase production yield compared with conventional methods of forming conductor patterns. Moreover, in this invention, because the conductor pattern 6 is formed by a printing operation and a pressing operation alone, compared with conventional methods of forming conductor patterns, the number of operations is reduced, making it possible to save time and effort. In addition, a conductor pattern 6 having a low surface resistivity can be easily and rapidly formed with this small number of operations.

Although not shown in the diagrams, the side of the base material 4 on which the conductor pattern 6 has been formed may be covered with a cover sheet. This cover sheet may be one formed of, for example, ethylene-vinyl acetate copolymer (EVA), non-crystalline PET (PET-G), or PET having a clear adhesive layer.

EXAMPLES

The invention is illustrated more fully below by way of examples.

Base Material (No. 1)

A PET film having a thickness of 100 μm (Toyobo Co., Ltd., product No. A4300) was used as the base material 4.

An 8 wt % receiving layer-forming solution was prepared by dissolving cellulose acetate butyrate having a number-average molecular weight of 70,000 (Eastman Chemical Japan KK; product No. CAB 381-20) as the cellulose acetate alkylate in methyl isobutyl ketone (MIRK).

Next, using a microgravure coater, the receiving layer-forming solution was coated onto the surface of the base material 4 under the following conditions: gravure plate, #70; rotational speed, 115 rpm; base material 4 transport speed, 1.5 m/min. This was then heated and dried by being passed through a 120° C. hot-air drying oven having a length of 12 m, thereby giving a base material 4 (No. 1) on the surface of which a receiving layer 5 had been formed. The receiving layer 5 on this base material 4 (No. 1) had a thickness, as measured in cross-section with a digital microscope manufactured by Keyence Corporation, of 4.3 μm Base Material (No. 2)

Aside from preparing a 20 wt % receiving layer-forming solution by dissolving cellulose acetate butyrate having a number-average molecular weight of 16,000 (Eastman Chemical Japan KK; product No. CAB 551-0.01) as the cellulose acetate alkylate in methyl isobutyl ketone (MIBK), a base material 4 (No. 2) having a receiving layer 5 formed on the surface thereof was obtained in the same way as base material 4 (No. 1). The receiving layer 5 on this base material 4 (No. 2) had a thickness, as measured in cross-section with a digital microscope (Keyence Corporation) of 1.8 μm.

Base Material (No. 3)

Aside from preparing an 18.5 wt % receiving layer-forming solution by dissolving cellulose acetate butyrate having a number-average molecular weight of 30,000 (Eastman Chemical Japan KK; product No. CAB 551-0.2) as the cellulose acetate alkylate in methyl isobutyl ketone (MIBK), a base material 4 (No. 3) having a receiving layer 5 formed on the surface thereof was obtained in the same way as base material 4 (No. 1). The receiving layer 5 on this base material 4 (No. 3) had a thickness, as measured in cross-section with a digital microscope (Keyence Corporation) of 2.2 μm.

Base Material (No. 4)

Aside from preparing an 18.5 wt % receiving layer-forming solution by dissolving cellulose acetate propionate having a number-average molecular weight of 15,000 (Eastman Chemical Japan KK; product No. CAP 504-0.2) as the cellulose acetate alkylate in methyl isobutyl ketone (MIBK), a base material 4 (No. 4) having a receiving layer formed on the surface thereof was obtained in the same way as base material 4 (No. 1). The receiving layer 5 on this base material 4 (No. 4) had a thickness, as measured in cross-section with a digital microscope (Keyence Corporation) of 3.8 μm.

Base Material (No. 5)

A PET film having a thickness of 100 μm (Toyobo Co., Ltd.; product No. A4300) was used as the base material 4.

The coating liquid described in Example 1 of Japanese Patent Application Laid-open No. 2008-283008 was prepared. This coating liquid contained no cellulose acetate alkylate.

Next, the above coating liquid was coated onto the surface of the base material 4, then heated and dried at 120° C. for 1.5 minutes, thereby giving a base material 4 (No. 5) on the surface of which a receiving layer 5 had been formed. The receiving layer 5 on this base material 4 (No. 5) had a thickness, as measured in cross-section with a digital microscope (Keyence Corporation), of 3.6 μm.

Conductive Paste (No. 1)

A preparation obtained by blending together 3 wt % of cellulose acetate butyrate (Eastman Chemical Japan KK; product No. CAB 551-0.01), 1 wt % of carbon black (Mitsubishi Chemical Corporation; product No. #2350), 90 wt % of silver powder (DOWA Hightech Co., Ltd.; AG-SMDK-101), 5 wt % of methyl isobutyl ketone (MIBK), and 1 wt % of diethylene glycol monoethyl ether acetate was used as the conductive paste 3 (No. 1).

Conductive Paste (No. 2)

The product number AF5200E available from Taiyo Ink Mfg Co., Ltd. was used as the conductive paste 3 (No. 2).

Conductive Paste (No. 3)

A preparation obtained by blending together 5 wt % of cellulose acetate butyrate (Eastman Chemical Japan KK; product No. CAB 551-0.2), 3 wt % of carbon black (Mitsubishi Chemical Corporation; product No. #2350), 80 wt % of silver powder (DOGMA Hightech Co., Ltd.; AG-SMDK-101), 10 wt % of methyl isobutyl ketone (MIBK), and 2 wt % of diethylene glycol monoethyl ether acetate was used as the conductive paste 3 (No. 3).

Intaglio Printing Plate

A copper plate having grid-like recesses 2 (width L/pitch P/depth D=23/250/13 (μm)) formed on the surface in the manner shown in FIG. 10 was used as the intaglio printing plate 1. The recesses 2 were formed by carrying out etching and copper electroplating on a copper plate. The printing plate 1 was then mounted onto the plate cylinder 9 of the gravure printing presses 8 shown in FIGS. 1 to 3 by being wrapped about the periphery of the plate cylinder 9 with the side on which recesses had been formed facing outward. In the gravure printing press 8 shown in FIG. 3, a supporting roller 11 is not provided, and the receiving layer side of the base material 4 comes into substantially linear contact with the side of the printing plate 1 having recesses thereon.

Example 1

Using a conductive paste 3 (No. 1) in combination with a base material 4 (No. 1) and using the gravure printing press 8 shown in FIG. 1, a conductor pattern 6 was formed by adjusting, as shown in Table 1 below, both the transport speed of the base material 4 (No. 1) and the contact time between the side of the printing plate 1 having recesses thereon and the receiving layer side of the base material 4 (No. 1), printing the conductive paste 3 (No. 1) onto the receiving layer side of the base material 4 (No. 1), then heating at 120° C. for 30 minutes to effect drying. FIG. 11A shows an image of the cross-section of this conductor pattern 6 captured with a digital microscope (KH-7700, manufactured by Hirox-Japan Co., Ltd.).

Example 2

Aside from changing, in the manner shown in Table 1 below, the transport speed of the base material 4 (No. 1) and the contact time between the side of the printing plate 1 having recesses thereon and the receiving layer side of the base material 4 (No. 1), a conductor pattern 6 was formed in the same way as in Example 1.

Example 3

Using a conductive paste 3 (No. 1) in combination with a base material 4 (No. 1) and using the gravure printing press 8 shown in FIG. 2, a conductor pattern 6 was formed by adjusting, as shown in Table 1 below, both the transport speed of the base material 4 (No. 1) and the contact time between the side of the printing plate 1 having recesses thereon and receiving layer side of the base material 4 (No. 1), printing the conductive paste 3 (No. 1) onto the receiving layer side of the base material 4 (No. 1), then heating at 120° C. for 30 minutes to effect drying.

Example 4

Aside from changing, in the manner shown in Table 1 below, the transport speed of the base material 4 (No. 1) and the contact time between the side of the printing plate 1 having recesses thereon and the receiving layer side of the base material 4 (No. 1), a conductor pattern 6 was formed in the same way as in Example 3.

Example 4-2

Using the heating and pressing apparatus 13 shown in FIG. 5, the conductor pattern 6 in Example 4 was heated and pressed at 115° C. and 2.54 kgf/cm$^2$ (249 kPa) for 50 minutes. FIG. 11B shows an image of the cross-section of this conductor pattern 6 captured with a digital microscope (KH-7700, manufactured by Hirox-Japan Co., Ltd.).

Example 4-3

Using the steam heating apparatus 17 shown in FIG. 6, the conductor pattern 6 in Example 4 was subjected to steam heating treatment with steam 7 at 85° C. and 90% humidity for 12 hours.

Example 4-4

Using the steam heating and pressing apparatus 20 shown in FIG. 6, the conductor pattern 6 in Example 4 was heat-treated with steam 7 while being pressed at 115° C., 90% humidity and 2.54 kgf/cm$^2$ (249 kPa) for 50 minutes.

Example 5

Using a conductive paste 3 (No. 1) in combination with a base material 4 (No. 1) and using the gravure printing press 8 shown in FIG. 3, a conductor pattern 6 was formed by adjusting, as shown in Table 1 below, both the transport speed of the base material 4 (No. 1) and the contact time between the side of the printing plate 1 having recesses thereon and the receiving layer side of the base material 4 (No. 1), printing the conductive paste 3 (No. 1) onto the receiving layer side of the base material 4 (No. 1), then heating at 120° C. for 30 minutes to effect drying.

Example 6

Aside from changing, in the manner shown in Table 1 below, the transport speed of the base material 4 (No. 1) and the contact time between the side of the printing plate 1 having recesses thereon and the receiving layer side of the base material 4 (No. 1), a conductor pattern 6 was formed in the same way as in Example 5.

Comparative Example 1

Using a conductive paste 3 (No. 1) in combination with a base material 4 (No. 5) and using the gravure printing press 8 shown in FIG. 3, a conductor pattern 6 was formed by adjusting, as shown in Table 1 below, both the transport speed of the base material 4 (No. 5) and the contact time between the side of the printing plate 1 having recesses thereon and the receiving layer side of the base material 4 (No. 5), printing the conductive paste 3 (No. 1) onto the receiving layer side of the base material 4 (No. 5), then heating at 120° C. for 30 minutes to effect drying.

The average conductor width, average pitch, average conductor thickness, aspect ratio (conductor thickness/conductor width), percent of conductor thickness embedded in the receiving layer 5 and surface resistivity of the conductor pattern 6 in Examples 1 to 6 and Comparative Example 1 are shown in Table 1 below.

conductive paste 3 (No. 1) onto the receiving layer side of the base material 4 (No. 2), then heating at 120° C. for 30 minutes to effect drying.

Example 8

Aside from changing, in the manner shown in Table 2 below, the transport speed of the base material 4 (No. 2) and the contact time between the side of the printing plate 1 having recesses thereon and the receiving layer side of the

TABLE 1

Conductor pattern forming conditions (combination of conductive paste No. 1 and base material No. 1 or 5)

| | Base material transport speed (m/min) | Contact time between plate side with recesses and receiving layer side of base material (seconds) | Pattern shape | Width/pitch/depth (μm) of recesses in printing plate | Gravure printing press | Treatment after printing | Average conductor width (μm) | Average pitch (μm) | Average conductor thickness (μm) | Aspect ratio (thickness/width) | Percent of conductor thickness embedded in receiving layer | Surface resistivity (Ω/) |
|---|---|---|---|---|---|---|---|---|---|---|---|---|
| Example 1 | 9.0 | 1.50 | grid-like | 23/250/13 | FIG. 1 | drying | 21.25 | 248.30 | 6.80 | 0.32 | 0.3 | 0.912 |
| Example 2 | 4.5 | 3.00 | grid-like | 23/250/13 | FIG. 1 | drying | 21.20 | 248.33 | 9.92 | 0.47 | 0.2 | 0.819 |
| Example 3 | 9.0 | 4.50 | grid-like | 23/250/13 | FIG. 2 | drying | 20.37 | 248.30 | 12.60 | 0.62 | 0.3 | 0.655 |
| Example 4 | 4.5 | 9.00 | grid-like | 23/250/13 | FIG. 2 | drying | 20.50 | 249.25 | 13.30 | 0.65 | 0.1 | 0.527 |
| Example 4-2 | 4.5 | 9.00 | grid-like | 23/250/13 | FIG. 2 | pressing | 21.27 | 248.69 | 1.22 | 0.06 | 82.3 | 0.260 |
| Example 4-3 | 4.5 | 9.00 | grid-like | 23/250/13 | FIG. 2 | steam heating | 20.68 | 249.36 | 13.06 | 0.63 | 0.3 | 0.310 |
| Example 4-4 | 4.5 | 9.00 | grid-like | 23/250/13 | FIG. 2 | pressing + steam heating | 20.98 | 249.28 | 1.37 | 0.07 | 85.5 | 0.208 |
| Example 5 | 9.0 | 0.15 | grid-like | 23/250/13 | FIG. 3 | drying | 21.31 | 247.71 | 4.42 | 0.21 | 0.2 | 3.413 |
| Example 6 | 4.5 | 0.30 | grid-like | 23/250/13 | FIG. 3 | drying | 20.80 | 248.49 | 4.96 | 0.24 | 0.3 | 1.836 |
| Comp. Ex. 1 | 9.0 | 0.15 | grid-like | 23/250/13 | FIG. 3 | drying | 24.81 | 247.01 | 1.78 | 0.07 | 0.2 | 23.95 |

The conductor patterns 6 in Examples 1 to 4-4 were confirmed to have lower surface resistivities and higher conductivities than the conductor patterns 6 in Examples 5 and 6. From comparisons of Example 1 with Example 2 and of Example 3 with Example 4, the surface resistivity of the conductor pattern 6 does not become much higher even when the transport speed of base material 4 (No. 1) is increased, thus confirming that enhanced productivity can be expected. In Examples 4-2 and 4-4 in which pressing treatment was carried out, the conductor pattern 6 flattened and became further embedded in the receiving layer 5, making the aspect ratio smaller. However, it was confirmed that, with pressing treatment, the surface resistivity becomes smaller and the conductivity becomes higher.

Example 7

Using a conductive paste 3 (No. 1) in combination with a base material 4 (No. 2) and using the gravure printing press 8 shown in FIG. 2, a conductor pattern 6 was formed by adjusting, as shown in Table 2 below, both the transport speed of the base material 4 (No. 2) and the contact time between the side of the printing plate 1 having recesses thereon and the receiving layer side of the base material 4 (No. 2), printing the base material 4 (No. 2), a conductor pattern 6 was formed in the same way as in Example 7.

Example 9

Using a conductive paste 3 (No. 1) in combination with a base material 4 (No. 2) and using the gravure printing press 8 shown in FIG. 3, a conductor pattern 6 was formed by adjusting, as shown in Table 2 below, both the transport speed of the base material 4 (No. 2) and the contact time between the side of the printing plate 1 having recesses thereon and the receiving layer side of the base material 4 (No. 2), printing the conductive paste 3 (No. 1) onto the receiving layer side of the base material 4 (No. 2), then heating at 120° C. for 30 minutes to effect drying.

Comparative Example 2

Using a conductive paste 3 (No. 1) in combination with a base material 4 (No. 5) and using the gravure printing press 8 shown in FIG. 3, a conductor pattern 6 was formed by adjusting, as shown in Table 2 below, both the transport speed of the base material 4 (No. 5) and the contact time between the side of the printing plate 1 having recesses thereon and the receiving layer side of the base material 4 (No. 5), printing the conductive paste 3 (No. 1) onto the receiving layer side of the base material 4 (No. 5), then heating at 120° C. for 30 minutes to effect drying.

The average conductor width, average pitch, average conductor thickness, aspect ratio (conductor thickness/conductor width), percent of conductor thickness embedded in the receiving layer 5 and surface resistivity of the conductor pattern 6 in Examples 7 to 9 and Comparative Example 2 are shown in Table 2 below.

the contact time between the side of the printing plate 1 having recesses thereon and the receiving layer side of the base material 4 (No. 3), a conductor pattern 6 was formed in the same way as in Example 10.

Example 12

Using a conductive paste 3 (No. 1) in combination with a base material 4 (No. 3) and using the gravure printing press 8

TABLE 2

Conductor pattern forming conditions (combination of conductive paste No. 1 and base material No. 2 or 5)

| | Base material transport speed (m/min) | Contact time between plate side with recesses and receiving layer side of base material (seconds) | Pattern shape | Width/pitch/depth (μm) of recesses in printing plate | Gravure printing press | Treatment after printing | Average conductor width (μm) | Average pitch (μm) | Average conductor thickness (μm) | Aspect ratio (thickness/width) | Percent of conductor thickness embedded in receiving layer | Surface resistivity (Ω/) |
|---|---|---|---|---|---|---|---|---|---|---|---|---|
| Example 7 | 9.0 | 4.50 | grid-like | 23/250/13 | FIG. 2 | drying | 20.27 | 249.10 | 11.30 | 0.56 | 0.3 | 0.699 |
| Example 8 | 4.5 | 9.00 | grid-like | 23/250/13 | FIG. 2 | drying | 20.65 | 248.32 | 12.31 | 0.60 | 0.2 | 0.643 |
| Example 9 | 4.5 | 0.30 | grid-like | 23/250/13 | FIG. 3 | drying | 19.98 | 248.77 | 3.90 | 0.20 | 0.2 | 5.143 |
| Comp. Ex. 2 | 4.5 | 0.30 | grid-like | 23/250/13 | FIG. 3 | drying | 23.97 | 247.84 | 2.04 | 0.09 | 0.1 | 18.36 |

The conductor patterns 6 in Examples 7 to 9 were confirmed to have lower surface resistivities and higher conductivities than the conductor pattern 6 in Comparative Example 2. In particular, the conductor patterns 6 in Examples 7 and 8 were confirmed to have even lower surface resistivities and higher conductivities than the conductor pattern 6 in Example 9. Moreover, from a comparison of Example 7 with Example 8, the surface resistivity of the conductor pattern 6 does not become much higher even when the transport speed of the base material 4 (No. 2) is increased, thus confirming that enhanced productivity can be expected.

Example 10

Using a conductive paste 3 (No. 1) in combination with a base material 4 (No. 3) and using the gravure printing press 8 shown in FIG. 2, a conductor pattern 6 was formed by adjusting, as shown in Table 3 below, both the transport speed of the base material 4 (No. 3) and the contact time between the side of the printing plate 1 having recesses thereon and the receiving layer side of the base material 4 (No. 3), printing the conductive paste 3 (No. 1) onto the receiving layer side of the base material 4 (No. 3), then heating at 120° C. for 30 minutes to effect drying.

Example 11

Aside from changing, in the manner shown in Table 3 below, the transport speed of the base material 4 (No. 3) and shown in FIG. 3, a conductor pattern 6 was formed by adjusting, as shown in Table 3 below, both the transport speed of the base material 4 (No. 3) and the contact time between the side of the printing plate 1 having recesses thereon and the receiving layer side of the base material 4 (No. 3), printing the conductive paste 3 (No. 1) onto the receiving layer side of the base material 4 (No. 3), then heating at 120° C. for 30 minutes to effect drying.

Comparative Example 3

Using a conductive paste 3 (No. 1) in combination with a base material 4 (No. 5) and using the gravure printing press 8 shown in FIG. 3, a conductor pattern 6 was formed by adjusting, as shown in Table 3 below, both the transport speed of the base material 4 (No. 5) and the contact time between the side of the printing plate 1 having recesses thereon and the receiving layer side of the base material 4 (No. 5), printing the conductive paste 3 (No. 1) onto the receiving layer side of the base material 4 (No. 5), then heating at 120° C. for 30 minutes to effect drying.

The average conductor width, average pitch, average conductor thickness, aspect ratio (conductor thickness/conductor width), percent of conductor thickness embedded in the receiving layer 5 and surface resistivity of the conductor pattern 6 in Examples 10 to 12 and Comparative Example 3 are shown in Table 3 below.

TABLE 3

Conductor pattern forming conditions
(combination of conductive paste No. 1 and base material No. 3 or 5)

| | Base material transport speed (m/min) | Contact time between plate side with recesses and receiving layer side of base material (seconds) | Pattern shape | Width/pitch/depth (μm) of recesses in printing plate | Gravure printing press | Treatment after printing | Average conductor width (μm) | Average pitch (μm) | Average conductor thickness (μm) | Aspect ratio (thickness/width) | Percent of conductor thickness embedded in receiving layer | Surface resistivity (Ω/) |
|---|---|---|---|---|---|---|---|---|---|---|---|---|
| Example 10 | 9.0 | 4.50 | grid-like | 23/250/13 | FIG. 2 | drying | 20.28 | 249.76 | 12.33 | 0.61 | 0.1 | 0.579 |
| Example 11 | 4.5 | 9.00 | grid-like | 23/250/13 | FIG. 2 | drying | 20.22 | 249.61 | 13.08 | 0.65 | 0.3 | 0.540 |
| Example 12 | 4.5 | 0.30 | grid-like | 23/250/13 | FIG. 3 | drying | 20.04 | 249.98 | 4.19 | 0.21 | 0.2 | 1.444 |
| Comp. Ex. 3 | 4.5 | 0.30 | grid-like | 23/250/13 | FIG. 3 | drying | 24.88 | 247.54 | 1.99 | 0.08 | 0.2 | 20.31 |

The conductor patterns 6 in Examples 10 to 12 were confirmed to have lower surface resistivities and higher conductivities than the conductor pattern 6 in Comparative Example 3. In particular, the conductor patterns 6 in Examples 10 and 11 were confirmed to have even lower surface resistivities and higher conductivities than the conductor pattern 6 in Example 12. Moreover, from a comparison of Example 10 with Example 11, the surface resistivity of the conductor pattern 6 does not become much higher even when the transport speed of the base material 4 (No. 3) is increased, thus confirming that enhanced productivity can be expected.

Example 13

Using a conductive paste 3 (No. 2) in combination with a base material 4 (No. 3) and using the gravure printing press 8 shown in FIG. 2, a conductor pattern 6 was formed by adjusting, as shown in Table 4 below, both the transport speed of the base material 4 (No. 3) and the contact time between the side of the printing plate 1 having recesses thereon and the receiving layer side of the base material 4 (No. 3), printing the conductive paste 3 (No. 2) onto the receiving layer side of the base material 4 (No. 3), then heating at 120° C. for 30 minutes to effect drying.

Example 14

Aside from changing, in the manner shown in Table 4 below, the transport speed of the base material 4 (No. 3) and the contact time between the side of the printing plate 1 having recesses thereon and the receiving layer side of the base material 4 (No. 3), a conductor pattern 6 was formed in the same way as in Example 13.

Example 15

Using a conductive paste 3 (No. 2) in combination with a base material 4 (No. 3) and using the gravure printing press 8 shown in FIG. 3, a conductor pattern 6 was formed by adjusting, as shown in Table 4 below, both the transport speed of the base material 4 (No. 3) and the contact time between the side of the printing plate 1 having recesses thereon and the receiving layer side of the base material 4 (No. 3), printing the conductive paste 3 (No. 2) onto the receiving layer side of the base material 4 (No. 3), then heating at 120° C. for 30 minutes to effect drying.

Comparative Example 4

Using a conductive paste 3 (No. 2) in combination with a base material 4 (No. 5) and using the gravure printing press 8 shown in FIG. 3, a conductor pattern 6 was formed by adjusting, as shown in Table 4 below, both the transport speed of the base material 4 (No. 5) and the contact time between the side of the printing plate 1 having recesses thereon and the receiving layer side of the base material 4 (No. 5), printing the conductive paste 3 (No. 2) onto the receiving layer side of the base material 4 (No. 5), then heating at 120° C. for 30 minutes to effect drying.

The average conductor width, average pitch, average conductor thickness, aspect ratio (conductor thickness/conductor width), percent of conductor thickness embedded in the receiving layer 5 and surface resistivity of the conductor pattern 6 in Examples 13 to 15 and Comparative Example 4 are shown in Table 4 below.

TABLE 4

Conductor pattern forming conditions
(combination of conductive paste No. 2 and base material No. 3 or 5)

| | Base material transport speed (m/min) | Contact time between plate side with recesses and receiving layer side of base material (seconds) | Pattern shape | Width/pitch/depth (μm) of recesses in printing plate | Gravure printing press | Treatment after printing | Average conductor width (μm) | Average pitch (μm) | Average conductor thickness (μm) | Aspect ratio (thickness/width) | Percent of conductor thickness embedded in receiving layer | Surface resistivity (Ω/) |
|---|---|---|---|---|---|---|---|---|---|---|---|---|
| Example 13 | 9.0 | 4.50 | grid-like | 23/250/13 | FIG. 2 | drying | 20.37 | 248.30 | 12.64 | 0.62 | 0.3 | 0.601 |

TABLE 4-continued

Conductor pattern forming conditions
(combination of conductive paste No. 2 and base material No. 3 or 5)

| | Base material transport speed (m/min) | Contact time between plate side with recesses and receiving layer side of base material (seconds) | Pattern shape | Width/pitch/ depth (μm) of recesses in printing plate | Gravure printing press | Treatment after printing | Average conductor width (μm) | Average pitch (μm) | Average conductor thickness (μm) | Aspect ratio (thickness/ width) | Percent of conductor thickness embedded in receiving layer | Surface resistivity (Ω/) |
|---|---|---|---|---|---|---|---|---|---|---|---|---|
| Example 14 | 4.5 | 9.00 | grid-like | 23/250/13 | FIG. 2 | drying | 20.50 | 249.25 | 13.29 | 0.65 | 0.3 | 0.485 |
| Example 15 | 4.5 | 0.30 | grid-like | 23/250/13 | FIG. 3 | drying | 20.80 | 248.49 | 4.54 | 0.22 | 0.3 | 1.355 |
| Comp. Ex. 4 | 4.5 | 0.30 | grid-like | 23/250/13 | FIG. 3 | drying | 24.44 | 247.32 | 1.79 | 0.07 | 0.3 | 19.31 |

The conductor patterns 6 in Examples 13 to 15 were confirmed to have lower surface resistivities and higher conductivities than the conductor pattern 6 in Comparative Example 4. In particular, the conductor patterns 6 in Examples 13 and 14 were confirmed to have even lower surface resistivities and higher conductivities than the conductor pattern 6 in Example 15. Moreover, from a comparison of Example 13 with Example 14, the surface resistivity of the conductor pattern 6 does not become much higher even when the transport speed of the base material 4 (No. 3) is increased, thus confirming that enhanced productivity can be expected.

Example 16

Using a conductive paste 3 (No. 2) in combination with a base material 4 (No. 4) and using the gravure printing press 8 shown in FIG. 2, a conductor pattern 6 was formed by adjusting, as shown in Table 5 below, both the transport speed of the base material 4 (No. 4) and the contact time between the side of the printing plate 1 having recesses thereon and the receiving layer side of the base material 4 (No. 4), printing conductive paste 3 (No. 2) onto the receiving layer side of the base material 4 (No. 4), then heating at 120° C. for 30 minutes to effect drying.

Comparative Example 5

Using a conductive paste 3 (No. 2) in combination with a base material 4 (No. 5) and using the gravure printing press 8 shown in FIG. 2, a conductor pattern 6 was formed by adjusting, as shown in Table 5 below, both the transport speed of the base material 4 (No. 5) and the contact time between the side of the printing plate 1 having recesses thereon and the receiving layer side of the base material 4 (No. 5), printing conductive paste 3 (No. 2) onto the receiving layer side of the base material 4 (No. 5), then heating at 120° C. for 30 minutes to effect drying.

The average conductor width, average pitch, average conductor thickness, aspect ratio (conductor thickness/conductor width), percent of conductor thickness embedded in the receiving layer 5 and surface resistivity of the conductor pattern 6 in Example 16 and Comparative Example 5 are shown in Table 5 below.

TABLE 5

Conductor pattern forming conditions
(combination of conductive paste No. 2 and base material No. 4 or 5)

| | Base material transport speed (m/min) | Contact time between plate side with recesses and receiving layer side of base material (seconds) | Pattern shape | Width/pitch/ depth (μm) of recesses in printing plate | Gravure printing press | Treatment after printing | Average conductor width (μm) | Average pitch (μm) | Average conductor thickness (μm) | Aspect ratio (thickness/ width) | Percent of conductor thickness embedded in receiving layer | Surface resistivity (Ω/) |
|---|---|---|---|---|---|---|---|---|---|---|---|---|
| Example 16 | 4.5 | 9.00 | grid-like | 23/250/13 | FIG. 2 | drying | 19.82 | 248.69 | 11.85 | 0.60 | 0.3 | 0.640 |
| Comp. Ex. 5 | 4.5 | 9.00 | grid-like | 23/250/13 | FIG. 2 | drying | 24.73 | 247.59 | 2.53 | 0.10 | 0.1 | 13.11 |

The conductor pattern 6 in Example 16 was confirmed to have a lower surface resistivity and a higher conductivity than the conductor pattern 6 in Comparative Example 5.

Figure 12:
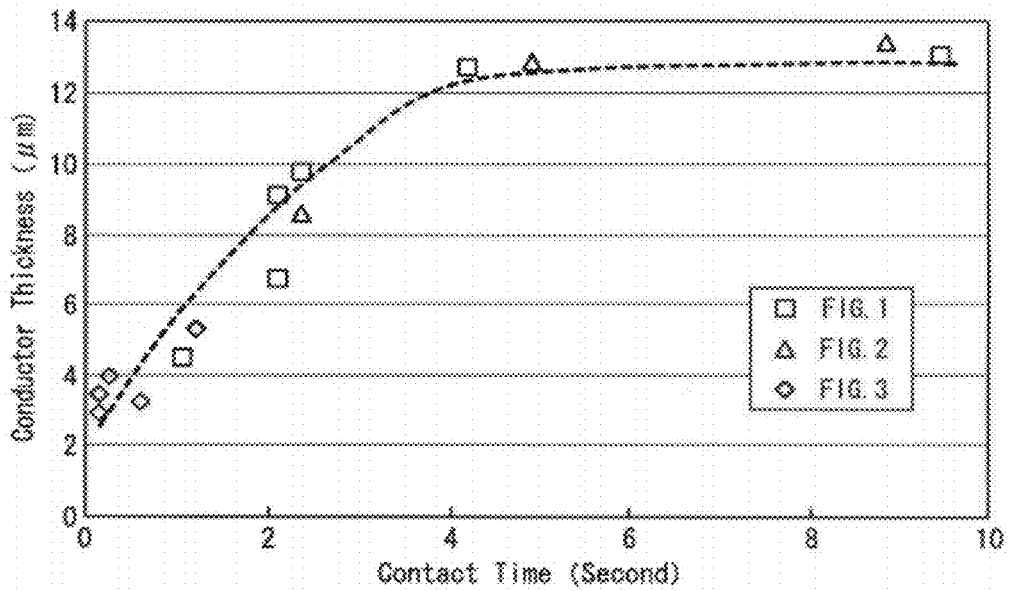
FIG. 12 is a graph showing the contact time between the side of an intaglio printing plate having recesses formed thereon and the side of a base material having a receiving layer formed thereon versus the conductor thickness of the conductor pattern that is formed.
Figure 13:
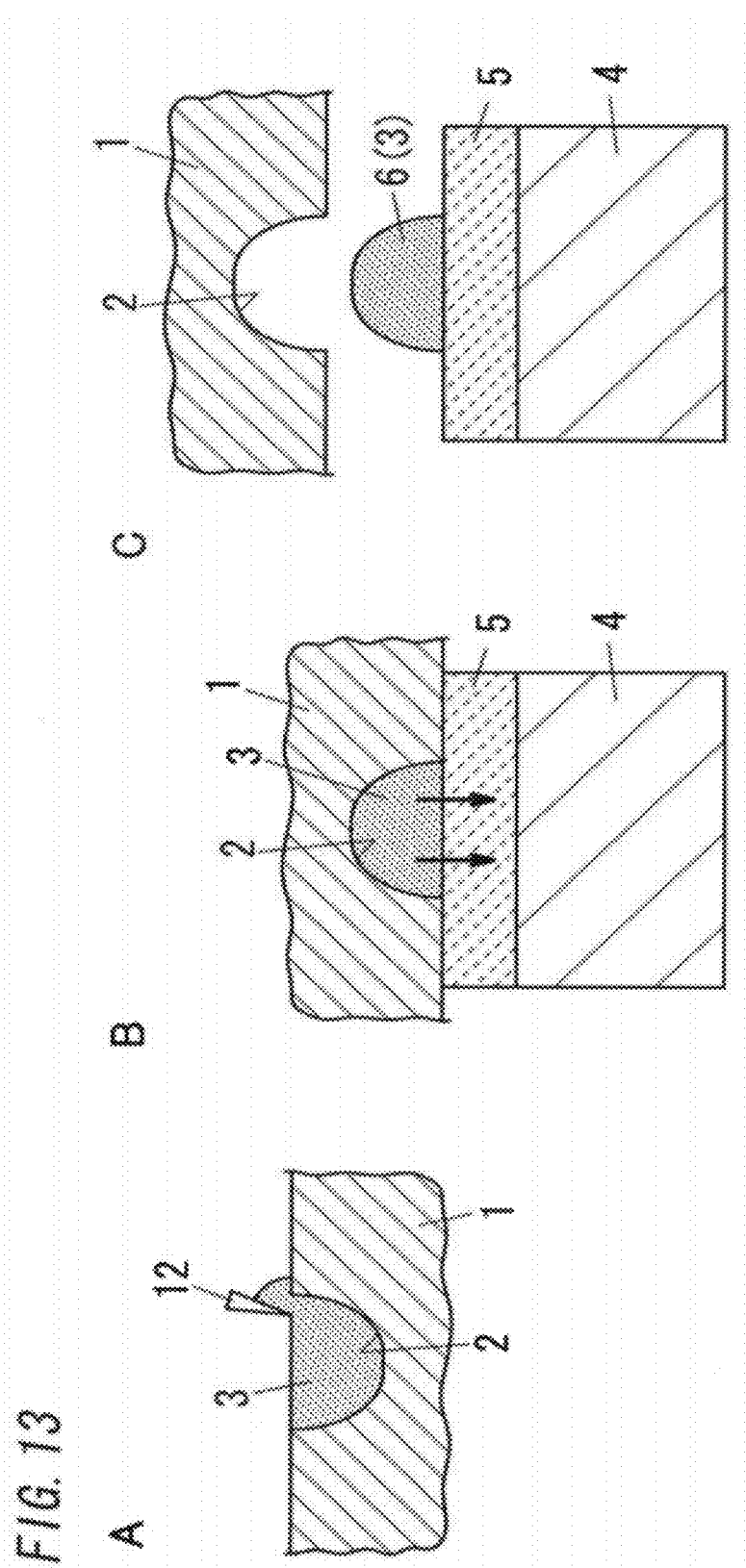
FIG. 13 shows an example of a conventional method of forming a conductor pattern, FIGS. 13A to 13C being enlarged schematic cross-sectional views depicting details of the method.

Contact Time Between Side of Printing Plate Having Recesses Thereon Formed and Receiving Layer Side of Base Material Versus Conductor Thickness of Conductor Pattern Formed Using a conductive paste 3 (No. 1) in combination with a base material 4 (No. 1) and using the gravure printing presses 8 shown in FIGS. 1 to 3, the conductive paste 3 (No. 1) was printed onto the receiving layer side of the base material 4 (No. 1) at varying contact times between the side of the printing plate 1 having recesses thereon and the receiving layer side of the base material 4 (No. 1) of from 0 to 10 seconds, following which heating was carried out at 120° C. for 30 minutes to effect drying, thereby forming a plurality of conductor patterns 6 of differing conductor thicknesses. The conductor widths of the conductor patterns 6 formed were all substantially the same. The data were plotted with the contact time between the side of the printing plate 1 having recesses thereon and the receiving layer side of the base material 4 (No. 1) on the horizontal axis and the conductor thickness of the conductor pattern 6 formed on the vertical axis, giving the graph shown in FIG. 12.

From this graph, it was confirmed that, in spite of the use of an intaglio printing plate 1 having high-aspect-ratio recesses 2 (width L/pitch P/depth D=23/250/13 (μm)) formed on the surface, at a contact time shorter than 0.5 second, the conductor thickness of the conductor pattern 6 that forms becomes 4 μm or less, resulting in a low aspect ratio. Moreover, it was confirmed from the graph shown in FIG. 12 that, although the aspect ratio rises abruptly in a contact time range of from 0.5 second to about 4 seconds, a high aspect ratio is maintained thereafter until about 10 seconds have elapsed. Accordingly, it appears that up until the above contact time is at least about 10 seconds, the receiving layer 5 continues to exhibit tack, enabling all the conductive paste 3 to be easily pulled from the recesses 2 even when the recesses 2 have a high aspect ratio.

Example 17

Figure 9:
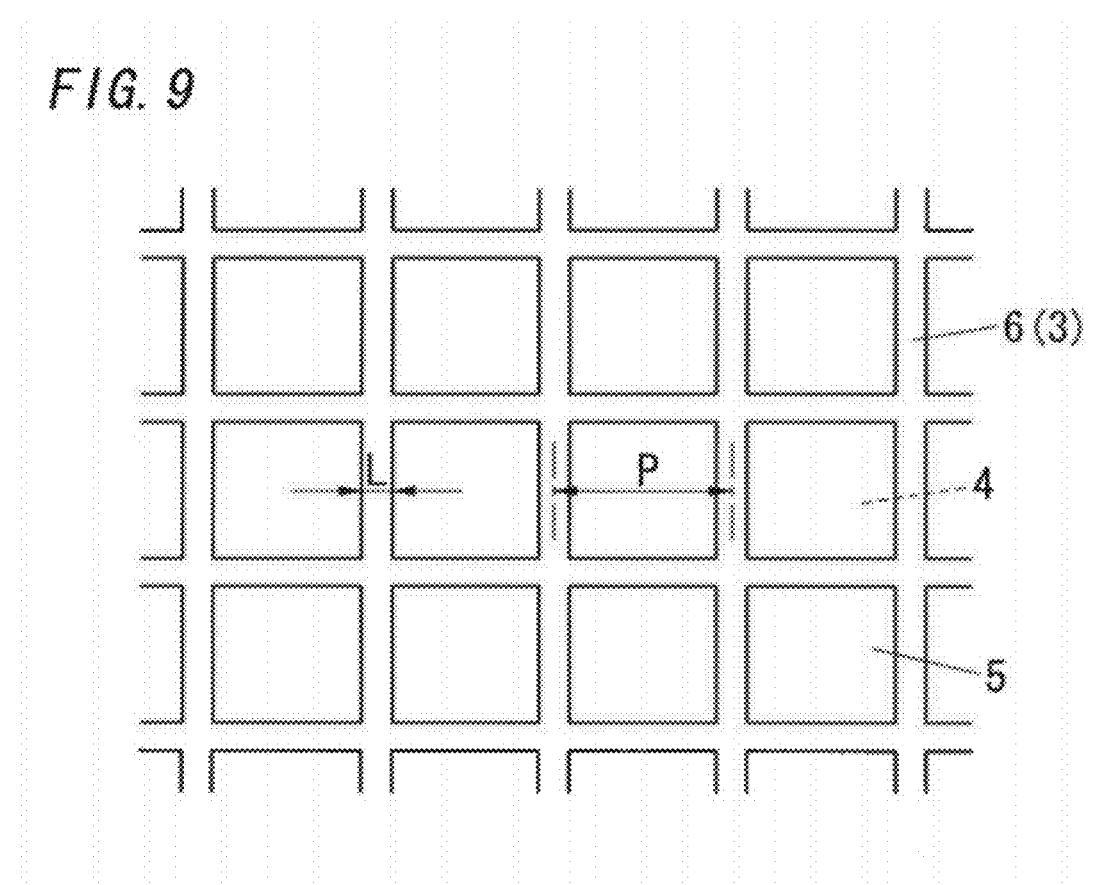
FIG. 9 is an enlarged top view showing a portion of a base material with a conductor pattern formed thereon.

First, using a screen printing technique, conductive paste 3 (No. 3) was printed in a grid-like or mesh-like manner as shown in FIG. 9 onto the surface of a base material 4 (No. 1). Printing was carried out using a screen plate having a line (L)/pitch (P) of 20 μm/250 μm.

Next, the conductive paste 3 (No. 3) that had been printed onto the surface of the base material 4 (No. 1) was dried by heating at 120° C. for 30 minutes. With this as the electromagnetic shielding material of Example 17, the surface resistivity of the conductor pattern 6 was measured and found to be 0.88Ω/. The line (L)/pitch (P) of this conductor pattern 6 was 20.2 μm/250.04 μm. The percentage of the conductor pattern 6 thickness embedded in the receiving layer 5 was 0.1%.

Example 18

Using the roll pressing apparatus 31 shown in FIG. 7, the electromagnetic shielding material of Example 17, in a warmed state achieved by 10 minutes of heating at a temperature of 130° C., was pressed by rollers 30 under the following conditions: 120° C., 20 kgf/cm² (2.0 MPa) and 3 m/min, thereby forming a conductor pattern 6. With this as the electromagnetic shielding material of Example 18, the surface resistivity of the conductor pattern 6 was measured and found to be 0.53Ω/. The line (L)/pitch (P) of this conductor pattern 6 was 21.1 μm/250.11 μm. The line (L)/pitch (P) of this conductor pattern 6 was 20.2 μm/250.04 μm. The percentage of the conductor pattern 6 thickness embedded in the receiving layer 5 was 63.3%. FIG. 11C shows an image of the cross-section of this conductor pattern 6 captured with a digital microscope (KH-7700, manufactured by Hirox-Japan Co., Ltd.).

Example 19

Using the roll pressing apparatus 32 shown in FIG. 8, the electromagnetic shielding material of Example 17, in a warmed state achieved by 10 minutes of heating at a temperature of 130° C., was pressed by rollers 30 under the following conditions: 130° C., 20 kgf/cm² (2.0 MPa) and 3 m/min, thereby forming a conductor pattern 6. With this as the electromagnetic shielding material of Example 19, the surface resistivity of the conductor pattern 6 was measured and found to be 0.41 Ωcm. The percentage of the conductor pattern 6 thickness embedded in the receiving layer 5 was 65.8%.

Example 20

Using the roll pressing apparatus 31 shown in FIG. 7, the electromagnetic shielding material of Example 17, after being held at room temperature (25° C.) and without being warming by heating above this temperature, was pressed by rollers 30 under the following conditions: 120° C., 20 kgf/cm² (2.0 MPa) and 3 m/min, thereby forming a conductor pattern 6. With this as the electromagnetic shielding material of Example 20, the surface resistivity of the conductor pattern 6 was measured and found to be 0.70Ω/. The line (L)/pitch (P) of this conductor pattern 6 was 38.9 μm/241.38 μm. The percentage of the conductor pattern 6 thickness embedded in the receiving layer 5 was 58.3%.

Comparative Example 6

First, using a screen printing technique, conductive paste 3 (No. 3) was printed in a grid-like or mesh-like manner as shown in FIG. 9 onto the surface of a base material 4 (No. 5). Printing was carried out using a screen plate having a line (L)/pitch (P) of 20 μm/250 μm.

Next, the conductive paste 3 (No. 3) that had been printed onto the surface of the base material 4 (No. 5) was dried by heating at 120° C. for 30 minutes. With this as the electromagnetic shielding material of Comparative Example 6, the surface resistivity of the conductor pattern 6 was measured and found to be 9.5Ω/. The line (L)/pitch (P) of this conductor pattern 6 was 24.3 μm/248.3 μm. The percentage of the conductor pattern 6 thickness embedded in the receiving layer 5 was 0.1%.

In Examples 4-2, 4-4 and 18 to 20, because 10% or more of the conductor thickness of the conductor pattern 6 was embedded in the receiving layer 5, i.e., 10% or more of the thickness of the conductor pattern 6 lay at or inward of the surface of the receiving layer 5, compared with the other examples of the invention and the comparative examples, the conductor pattern 6 had a high adherence to the receiving layer 5.

The invention claimed is:

1. A base material with a conductor pattern formed thereon, comprising:
    a base material;
    a receiving layer formed on the base material, the receiving layer being made of a cellulose acetate alkylate; and
    a conductor pattern formed on the receiving layer, the conductor pattern being formed of a conductive paste having a predetermined shape,
    wherein 10% or more of a conductor thickness of the conductor pattern is embedded in the receiving layer.

2. The base material with a conductor pattern formed thereon according to claim 1, wherein the conductor pattern has the conductor thickness of 0.5 μm or more.

3. The base material with a conductor pattern formed thereon according to claim 1, wherein the cellulose acetate alkylate used is at least one selected from among cellulose acetate butyrate, cellulose acetate propionate and cellulose acetate propionate butyrate.

4. The base material with a conductor pattern formed thereon according to claim 1, wherein the conductor pattern is formed by heat-treating the conductive paste with steam.

5. The base material with a conductor pattern formed thereon according to claim 1, wherein the conductor pattern is formed by pressing the conductive paste.

6. The base material with a conductor pattern formed thereon according to claim 1, wherein the conductor pattern is formed by pressing the conductive paste with a roller in a heated state.

7. A method of foaming a base material with a conductor pattern thereon, comprising the steps of:
   providing a base material;
   forming a receiving layer made of a cellulose acetate alkylate on the base material; and
   forming a conductor pattern by arranging a conductive paste in a predetermined shape on the receiving layer,
   wherein the conductor pattern is formed on the receiving layer in such a way that 10% or more of a thickness of the conductor pattern lies at or inward of a surface of the receiving layer.

8. The method according to claim 7, wherein the conductor pattern is formed to the thickness of 0.5 μm or more.

9. The method according to claim 7, wherein the cellulose acetate alkylate is at least one selected from among cellulose acetate butyrate, cellulose acetate propionate and cellulose acetate propionate butyrate.

10. A method of forming a base material with a conductor pattern thereon, comprising the steps of:
    providing a base material;
    forming a receiving layer made of a cellulose acetate alkylate on the base material; and
    forming a conductor pattern by arranging a conductive paste in a predetermined shape on the receiving layer,
    wherein the conductor pattern is formed by at least one selected from among heat-treating the conductive paste with steam, pressing the conductive paste and pressing the conductive paste with a roller in a heated state.

* * * * *